(12) United States Patent
Hoshino et al.

(10) Patent No.: US 11,970,649 B2
(45) Date of Patent: *Apr. 30, 2024

(54) LIQUID CRYSTAL COMPOSITION, LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Wataru Hoshino, Kanagawa (JP); Hiroshi Matsuyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 409 days.

This patent is subject to a terminal disclaimer.

(21) Appl. No.: 17/331,377

(22) Filed: May 26, 2021

(65) Prior Publication Data

US 2021/0309915 A1 Oct. 7, 2021

Related U.S. Application Data

(63) Continuation of application No. PCT/JP2019/047998, filed on Dec. 9, 2019.

(30) Foreign Application Priority Data

Dec. 12, 2018 (JP) ................................. 2018-232454

(51) Int. Cl.
| | |
|---|---|
| C09K 19/38 | (2006.01) |
| C09K 19/56 | (2006.01) |
| C09K 19/60 | (2006.01) |
| G02B 5/30 | (2006.01) |

(52) U.S. Cl.
CPC .......... *C09K 19/3852* (2013.01); *C09K 19/56* (2013.01); *C09K 19/601* (2013.01); *G02B 5/3016* (2013.01)

(58) Field of Classification Search
CPC ....................................................... G02F 1/13
See application file for complete search history.

(56) References Cited

U.S. PATENT DOCUMENTS

| | | | |
|---|---|---|---|
| 2013/0187090 A1 | 7/2013 | Goto | |
| 2018/0267368 A1 | 9/2018 | Takahashi et al. | |
| 2019/0071571 A1 | 3/2019 | Takada et al. | |
| 2019/0322937 A1* | 10/2019 | Matsuyama | ....... C09K 19/3491 |

FOREIGN PATENT DOCUMENTS

| | | | |
|---|---|---|---|
| CN | 102822142 A | 12/2012 | |
| CN | 108291999 A | 7/2018 | |
| JP | 11-101964 A | 4/1999 | |
| JP | H11101964 A | * 4/1999 | |
| WO | 2017/195833 A1 | 11/2017 | |
| WO | 2018/124198 A1 | 7/2018 | |
| WO | WO-2018124198 A1 | * 7/2018 | ............... B32B 7/02 |

OTHER PUBLICATIONS

Office Action, issued by the State Intellectual Property Office of China dated Aug. 18, 2022, in connection with Chinese Patent Application No. 201980081767.2.
Office Action, issued by the Japanese Patent Office dated Oct. 19, 2021, in connection with Japanese Patent Application No. 2020-124432.
International Search Report issued in PCT/JP2019/047998 dated Mar. 10, 2020.
Written Opinion issued in PCT/JP2019/047998 dated Mar. 10, 2020.
International Preliminary Report on Patentability completed by WIPO dated Jun. 8, 2021 in connection with International Patent Application No. PCT/JP2019/047998.

* cited by examiner

*Primary Examiner* — Chanceity N Robinson
(74) *Attorney, Agent, or Firm* — Edwards Neils LLC; Jean C. Edwards, Esq.

(57) ABSTRACT

A liquid crystal composition with a light absorption anisotropic film that has a high alignment degree, a light absorption anisotropic film, a laminate, and an image display device. The liquid crystal composition contains a high-molecular weight liquid crystal compound, and a dichroic substance, where the liquid crystal compound is a copolymer having a repeating unit (1) represented by Formula (1) and a repeating unit (2) represented by Formula (2), where P1 and P2 represent the main chain of the repeating unit, L1 represents a single bond or a divalent linking group, L2 represents a single bond, a divalent alicyclic group or an aromatic group, which may have a substituent, SP1 represents a spacer group, SP2 represents an alkylene group having 10 or more atoms in the main chain, M1 represents a mesogenic group, and T1 and T2 represent a terminal group.

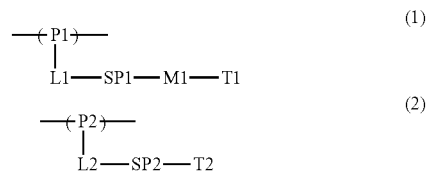

21 Claims, No Drawings

LIQUID CRYSTAL COMPOSITION, LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2019/047998 filed on Dec. 9, 2019, which was published under PCT Article 21(2) in Japanese, and which claims priority under 35 U.S.C. § 119(a) to Japanese Patent Application No. 2018-232454 filed on Dec. 12, 2018. The above is applications are hereby expressly incorporated by reference, in-its their entirety, into the present application.

BACKGROUND OF THE INVENTION

1. Field of the Invention

The present invention relates to a liquid crystal composition, a light absorption anisotropic film, a laminate, and an image display device.

2. Description of the Related Art

In the past, devices which are operated by different principles for each function have been used in a case where an attenuation function, a polarization function, a scattering function, a shielding function, or the like is required in relation to irradiated light including laser light and natural light. Therefore, products corresponding to the above-described functions have been manufactured through different manufacturing steps for each function.

For example, in an image display device (for example, a liquid crystal display device), a linear or circular polarizer is used to control optical activity or birefringence in the display. Further, in an organic light emitting diode (OLED), a circular polarizer is also used to prevent the reflection of external light.

In the related art, iodine has been widely used as a dichroic substance in these polarizers. However, a polarizer using an organic dye as a dichroic substance instead of iodine has also been examined.

For example, WO 2017/195833A describes forming a light absorption anisotropic film using a liquid crystal composition (a coloring composition) containing a dichroic substance (a dichroic dye compound) and a high-molecular weight liquid crystal compound composed of only a repeating unit having a mesogenic group (Example 19 or the like).

SUMMARY OF THE INVENTION

As a result of the studies of the inventors of the present invention on the light absorption anisotropic film described in WO 2017/195833A, it was revealed that although a high alignment degree is exhibited, there is room for improvement in the adhesiveness between the light absorption anisotropic film and the underlying layer (for example, a base material or an alignment film), and the plane shape uniformity of the light absorption anisotropic film, depending on the kind of high-molecular weight liquid crystal compound that is used for forming a light absorption anisotropic film.

An object of the present invention is to provide a liquid crystal composition with which a light absorption anisotropic film that is excellent in adhesiveness and plane shape uniformity and has a high alignment degree can be formed, a light absorption anisotropic film, a laminate, and an image display device.

As a result of diligent studies to solve the above problems, the inventors of the present invention have found that in a case where a high-molecular weight liquid crystal compound that is blended with a dichroic substance has repeating units (1) and (2) which have a specific structure, a light absorption anisotropic film excellent in adhesiveness and plane shape uniformity and having a high alignment degree can be obtained, and have completed the present invention.

That is, the inventors of the present invention found that the above-described problems can be solved by the following configurations.

[1] A liquid crystal composition comprising a high-molecular weight liquid crystal compound; and a dichroic substance,
   in which high-molecular weight liquid crystal compound is a copolymer having a repeating unit (1) represented by Formula (1) and a repeating unit (2) represented by Formula (2),
   in Formula (1), P1 represents a main chain of the repeating unit, L1 represents a single bond or a divalent linking group, SP1 represents a spacer group, M1 represents a mesogenic group, and T1 represents a terminal group,
   in Formula (2), P2 represents a main chain of the repeating unit,
   in Formula (2), L2 represents a single bond, a divalent alicyclic group which may have a substituent, or a divalent aromatic group which may have a substituent,
   in Formula (2), SP2 represents an alkylene group having 10 or more atoms in the main chain, where one or more pieces of —$CH_2$— constituting an alkylene group represented by SP2 may be substituted with at least one group selected from the group consisting of —O—, —S—, —N($R^{21}$)—, —C(=O)—, —C(=S)—, —C($R^{22}$)=C($R^{23}$)—, an alkynylene group, —Si($R^{24}$)($R^{25}$)—, —N=N—, —C($R^{26}$)=N—N=C($R^{27}$)—, —C($R^{28}$)=N—, and —S(=O)$_2$—, $R^{21}$ to $R^{28}$ each independently represent a hydrogen atom, a halogen atom, a cyano group, a nitro group or a linear or branched alkyl group having 1 to 10 carbon atoms, and hydrogen atoms contained in the one or more pieces of —$CH_2$— constituting an alkylene group represented by SP2 may be substituted with at least one group selected from the group consisting of a halogen atom, a cyano group, a nitro group, a hydroxyl group, a linear alkyl group having 1 to 10 carbon atoms, and a branched alkyl groups having 1 to 10 carbon atoms, and
   in Formula (2), T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an epoxycycloalkyl group, a maleimide group, an oxetanyl group which may have a substituent, or a phenyl group which may have a substituent.

[2] The liquid crystal composition according to [1], in which in Formula (2), the number of atoms in the main chain of SP2 is 15 or more.

[3] The liquid crystal composition according to [1] or [2], in which in Formula (2), T2 is a vinyl group, an acryloyloxy group, a methacryloyloxy group, an epoxy group, an epoxycycloalkyl group, a maleimide group, or an oxetanyl group which may have a substituent.

[4] The liquid crystal composition according to any one of [1] to [3], in which in Formula (2), the one or more pieces of —$CH_2$— constituting an alkylene group represented by SP2 are substituted at least one group selected from the group consisting of —O—, —N($R^{21}$)—, and —C(=O)—.

[5] The liquid crystal composition according to any one of [1] to [4], in which a content of the repeating unit (2) is 4% to 20% by mass with respect to a total mass of all repeating units contained in the high-molecular weight liquid crystal compound.

[6] A light absorption anisotropic film which is formed from the liquid crystal composition according to any one of [1] to [5].

[7] A laminate comprising a base material; and the light absorption anisotropic film according to [6], which is provided on the base material.

[8] The laminate according to [7], further comprising: a λ/4 plate which is provided on the light absorption anisotropic film.

[9] An image display device comprising the light absorption anisotropic film according to [6] or the laminate according to [7] or [8].

According to the present invention, it is possible to provide a liquid crystal composition with which a light absorption anisotropic film that is excellent in adhesiveness and plane shape uniformity and has a high alignment degree can be formed, a light absorption anisotropic film, a laminate, and an image display device.

DESCRIPTION OF THE PREFERRED EMBODIMENTS

In the following description, the present invention will be described in more detail.

The following description of constituent requirements is based on representative embodiments of the invention; however, the present invention is not limited thereto.

A numerical value range represented using "to" in the present specification means a range including the numerical values described before and after "to" as the lower limit and the upper limit respectively.

In this specification, the term (meth)acrylic acid is a generic term for "acrylic acid" and "methacrylic acid", and the term (meth)acryloyl is a generic term for "acryloyl" and "methacryloyl".

[Liquid Crystal Composition]

A liquid crystal composition according to the embodiment of the present invention is a liquid crystal composition containing a high-molecular weight liquid crystal compound, and a dichroic substance, where the high-molecular weight liquid crystal compound is a copolymer having a repeating unit (1) represented by Formula (1) and a repeating unit (2) represented by Formula (2).

According to the liquid crystal composition according to the embodiment of the present invention, it is possible to form a light absorption anisotropic film that is excellent in adhesiveness and plane shape uniformity and has a high alignment degree. The details of the reason for the above are not clear; however, it is presumed as follows.

The high-molecular weight liquid crystal compound in the present invention has a repeating unit (1) having a mesogenic group and a repeating unit (2) having a flexible structure that includes a long molecular chain (SP2 of Formula (2)). In a case of including the repeating unit (2) as described above, molecular chains constituting a high-molecular weight liquid crystal compound are easily entangled with each other, and thus the cohesion destruction of the light absorption anisotropic film (specifically, destruction of the light absorption anisotropic film itself) is suppressed. As a result, it is presumed that the adhesiveness between the light absorption anisotropic film and the underlying layer (for example, the base material or the alignment film) is improved.

Further, it is conceived that the decrease in plane shape uniformity is caused by the low compatibility between the dichroic substance and the high-molecular weight liquid crystal compound. That is, in a case where the dichroic substance and the high-molecular weight liquid crystal compound have insufficient compatibility, it is conceived that the dichroic substance forms a precipitate, which becomes a defective core that generates a plane shape defect (an alignment defect). As an approach for solving this problem, in a case where the high-molecular weight liquid crystal compound has a flexible structure including the long molecular chain (SP2 of Formula (2)), it is presumed that the precipitation of the dichroic substance is suppressed, and thus a light absorption anisotropic film excellent in plane shape uniformity can be obtained.

Here, "excellent in plane shape uniformity" means that a liquid crystal composition containing a high-molecular weight liquid crystal compound has few alignment defects caused by being repelled on an underlying layer (for example, a base material or an alignment film).

[High-Molecular Weight Liquid Crystal Compound]

The high-molecular weight liquid crystal compound is a copolymer of a repeating unit (1) and a repeating unit (2) and may be any polymer of a block polymer, an alternating polymer, a random polymer, a graft polymer, and the like.

<Repeating Unit (1)>

The high-molecular weight liquid crystal compound contained in the liquid crystal composition according to the embodiment of the present invention contains a repeating unit (1) represented by Formula (1).

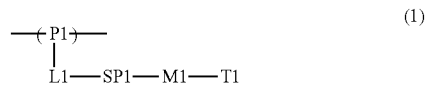

In Formula (1), P1 represents a main chain of the repeating unit, L1 represents a single bond or a divalent linking group, SP1 represents a spacer group, M1 represents a mesogenic group, and T1 represents a terminal group.

Specific examples of the main chain of the repeating unit represented by P1 include groups represented by Formulae (P1-A) to (P1-D). Among these, a group represented by Formula (P1-A) is preferable from the viewpoint of the diversity of monomers as raw materials and ease of handling.

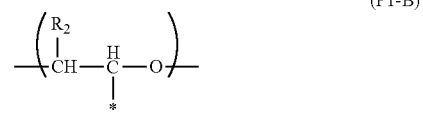

-continued

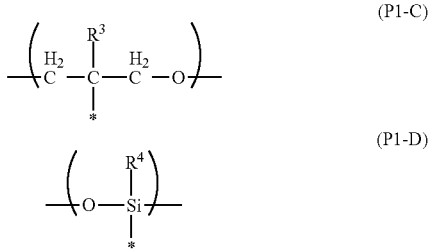

In Formulae (P1-A) to (P1-D), "*" represents a bonding position to L1 in Formula (1). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or may be an alkyl group (a cycloalkyl group) having a cyclic structure. The alkyl group preferably has 1 to 5 carbon atoms.

The group represented by Formula (P1-A) is preferably an unit of a partial structure of a poly(meth)acrylic acid ester obtained by polymerizing a (meth)acrylic acid ester.

The group represented by Formula (P1-B) is preferably an ethylene glycol unit formed by subjecting an epoxy group of a compound having an epoxy group to ring-opening polymerization.

The group represented by Formula (P1-C) is preferably a propylene glycol unit formed by subjecting an oxetane group of a compound having an oxetane group to ring-opening polymerization.

The group represented by Formula (P1-D) is preferably a siloxane unit of a polysiloxane obtained by polycondensation of a compound having at least one of an alkoxysilyl group or a silanol group. Here, examples of the compound having at least one of an alkoxysilyl group or a silanol group include a compound having a group represented by Formula $SiR^4(OR^5)_2$—. In the formula, $R^4$ is synonymous with $R^4$ in (P1-D), and a plurality of $R^5$'s each independently represent a hydrogen atom or an alkyl group having 1 to 10 carbon atoms.

L1 is a single bond or a divalent linking group.

Examples of the divalent linking group represented by L1 include —C(O)O—, —OC(O)—, —O—, —S—, —C(O)NR$^4$—, —NRC(O)—, —S(O)$_2$—, and —NR$^4$R$^5$—. In the formula, $R^4$ and $R^5$ each independently represent a hydrogen atom or an alkyl group having 1 to 6 carbon atoms which may have a substituent (for example, a substituent W which will be described later). In the specific examples of the divalent linking group, a left bonding hand is bonded to P1, and a right bonding hand is bonded to SP1.

In a case where P1 is a group represented by Formula (P1-A), L1 is preferably a group represented by —C(O)O— from the viewpoint that the effects of the present invention are more excellent.

In a case where P1 is a group represented by Formulae (P1-B) to (P1-D), L1 is preferably a single bond from the viewpoint that the effects of the present invention are more excellent.

The spacer group represented by SP1 preferably includes at least one structure selected from the group consisting of an oxyethylene structure, an oxypropylene structure, a polysiloxane structure, and a fluorinated alkylene structure, or a linear branched alkylene group having 2 to 20 carbon atoms. However, the alkylene group may contain —O—, —O—CO—, —CO—O—, or —O—CO—O—.

The spacer group represented by SP1 preferably includes at least one structure selected from the group consisting of an oxyethylene structure, an oxypropylene structure, a polysiloxane structure, and a fluorinated alkylene structure from the point of the easy exhibition of liquid crystallinity, raw material availability, and the like.

Here, the oxyethylene structure represented by SP1 is preferably a group represented by *—(CH$_2$—CH$_2$O)$_{n1}$—*. In the formula, n1 represents an integer of 1 to 20, and * represents a bonding position to L1 or M1. n1 is preferably an integer of 2 to 10, more preferably an integer of 2 to 4, and most preferably 3, from the viewpoint that the effects of the present invention are more excellent.

The oxypropylene structure represented by SP1 is preferably a group represented by *—(CH(CH$_3$)—CH$_2$O)$_{n2}$—* from the viewpoint that the effects of the present invention are more excellent. In the formula, n2 represents an integer of 1 to 3, and * represents a bonding position to L1 or M1.

The polysiloxane structure represented by SP1 is preferably a group represented by *—(Si(CH$_3$)$_2$O)$_{n3}$—* from the viewpoint that the effects of the present invention are more excellent. In the formula, n3 represents an integer of 6 to 10, and * represents a bonding position to L1 or M1.

The fluorinated alkylene structure represented by SP1 is preferably a group represented by *—(CF$_2$—CF$_2$)$_{n2}$—* from the viewpoint that the effects of the present invention are more excellent. In the formula, n4 represents an integer of 6 to 10, and * represents a bonding position to L1 or M1.

The mesogenic group represented by M1 is a group indicating the main skeleton of liquid crystalline molecules contributing to the formation of the liquid crystal. The liquid crystalline molecule exhibits liquid crystallinity in an intermediate state (a mesophase) between a crystalline state and an isotropic liquid state. The mesogenic group is not particularly limited, and for example, the description on pages 7 to 16 of "Flussige Kristalle in Tabellen II" (VEB Deutsche Verlag fur Grundstoff Industrie, Leipzig, 1984) and the description in Chapter 3 of Liquid Crystal Handbook (Maruzen, 2000) edited by Liquid Crystal Handbook Editing Committee can be referred to.

The mesogenic group is preferably a group having at least one cyclic structure selected from the group consisting of an aromatic hydrocarbon group, a heterocyclic group, and an alicyclic group.

The mesogenic group preferably has an aromatic hydrocarbon group, more preferably 2 to 4 aromatic hydrocarbon groups, and still more preferably 3 aromatic hydrocarbon groups, from the viewpoint that the effects of the present invention are more excellent.

The mesogenic group represented by M1 is preferably a group represented by Formula (M1-A) or Formula (M1-B) and more preferably a group represented by Formula (M1-B), from the viewpoints of the exhibition of liquid crystallinity, the adjustment of the liquid crystal phase transition temperature, and the availability and the synthetic suitability of raw materials, and due to the fact that the effect of the present invention is more excellent.

(M1-A)

(M1-B)

In Formula (M1-A), A1 is a divalent group selected from the group consisting of an aromatic hydrocarbon group, a heterocyclic group, and an alicyclic group. These groups may be substituted with a substituent such as an alkyl group, a fluorinated alkyl group, an alkoxy group or a substituent W which will be described later.

The divalent group represented by A1 is preferably a 4- to 6-membered ring. The divalent group represented by A1 may be monocyclic or condensed.

\* represents a bonding position to SP1 or T1.

Examples of the divalent aromatic hydrocarbon group represented by A1 include a phenylene group, a naphthylene group, a fluorene-diyl group, anthracene-diyl group, and a tetracene-diyl group, and from the viewpoint of the diversity of the design of a mesogenic skeleton and raw material availability, a phenylene group or a naphthylene group is preferable, and a phenylene group is more preferable.

The divalent heterocyclic group represented by A1 may be aromatic or non-aromatic; however, it is preferably a divalent aromatic heterocyclic group from the viewpoint of a further improvement in the alignment degree.

Examples of the atom other than the carbon atoms of the divalent aromatic heterocyclic group include a nitrogen atom, a sulfur atom, and an oxygen atom. In a case where the aromatic heterocyclic group has a plurality of ring-constituting atoms other than the carbon atom, these may be the same or different from each other.

Specific examples of the divalent aromatic heterocyclic group include a pyridylene group (a pyridine-diyl group), a pyridazine-diyl group, an imidazole-diyl group, a thienylene (a thiophene-diyl group), a quinolylene group (a quinoline-diyl group), an isoquinolylene group (an isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same or different from each other.

In Formula (M1-B), A2 and A3 each independently represent a divalent group selected from the group consisting of an aromatic hydrocarbon group, a heterocyclic group, and an alicyclic group. Since specific examples and preferred aspects of A2 and A3 are the same as those of A1 of Formula (M1-A), the description thereof will be omitted.

In Formula (M1-B), a2 represents an integer of 1 to 10. In a case where a2 is 2 or more, a plurality of A2's may be the same or different from each other, a plurality of A3's may be the same or different each other, and a plurality of LA1's may be the same or different from each other. a2 is preferably an integer of 2 or more and more preferably 2 from the viewpoint that the effects of the present invention are more excellent.

In Formula (M1-B), in a case where a2 is 1, LA1 is a divalent linking group. In a case where a2 is 2 or more, a plurality of LA1's each independently represent a single bond or a divalent linking group, and at least one of the plurality of LA1's is a divalent linking group. In a case where a2 is 2, it is preferable that one of the two LA1s is a divalent linking group and the other is a single bond from the viewpoint that the effects of the present invention are more excellent.

Examples of the divalent linking group represented by LA1 in Formula (M1-B) include —O—, $(CH_2)_g$—, —$(CF_2)_g$—, —$Si(CH_3)_2$—, —$(Si(CH_3)_2)_g$—, —$(OSi(CH_3)_2)_g$— (g represents an integer of 1 to 10), —N(Z)—, —C(Z)=C(Z')—, —C(Z)=N—, —N=C(Z)—, —C(Z)_2—C(Z')_2—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')—(Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Of them, —C(O)O— is preferable from the viewpoint that the effects of the present invention are more excellent. LA1 may be a group formed by combining two or more of the above groups.

Specific examples of M1 include the following structures. In the following specific examples, "Ac" represents an acetyl group.

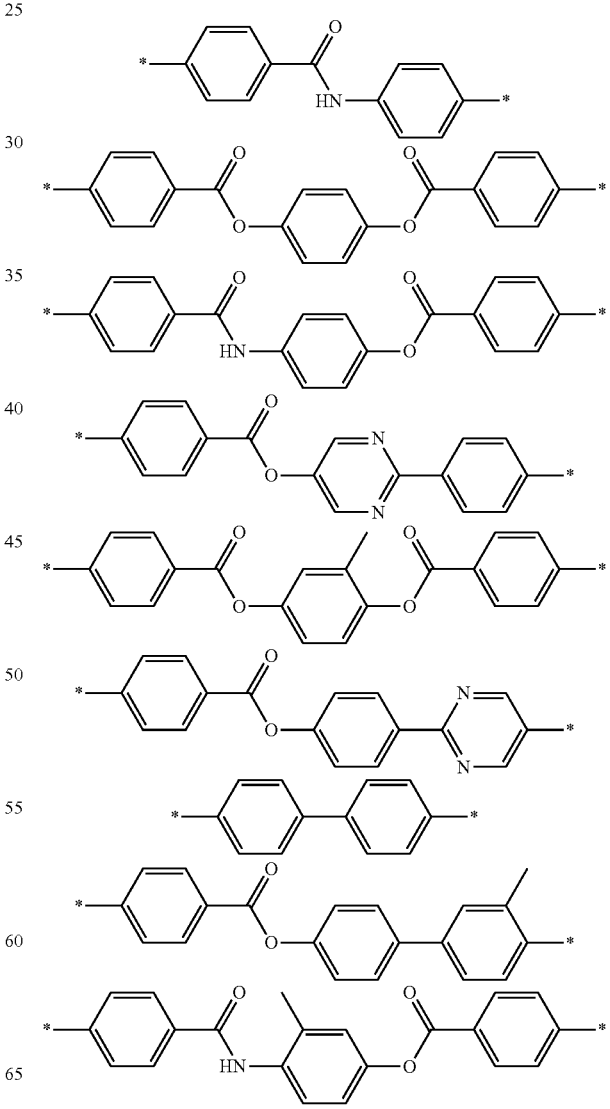

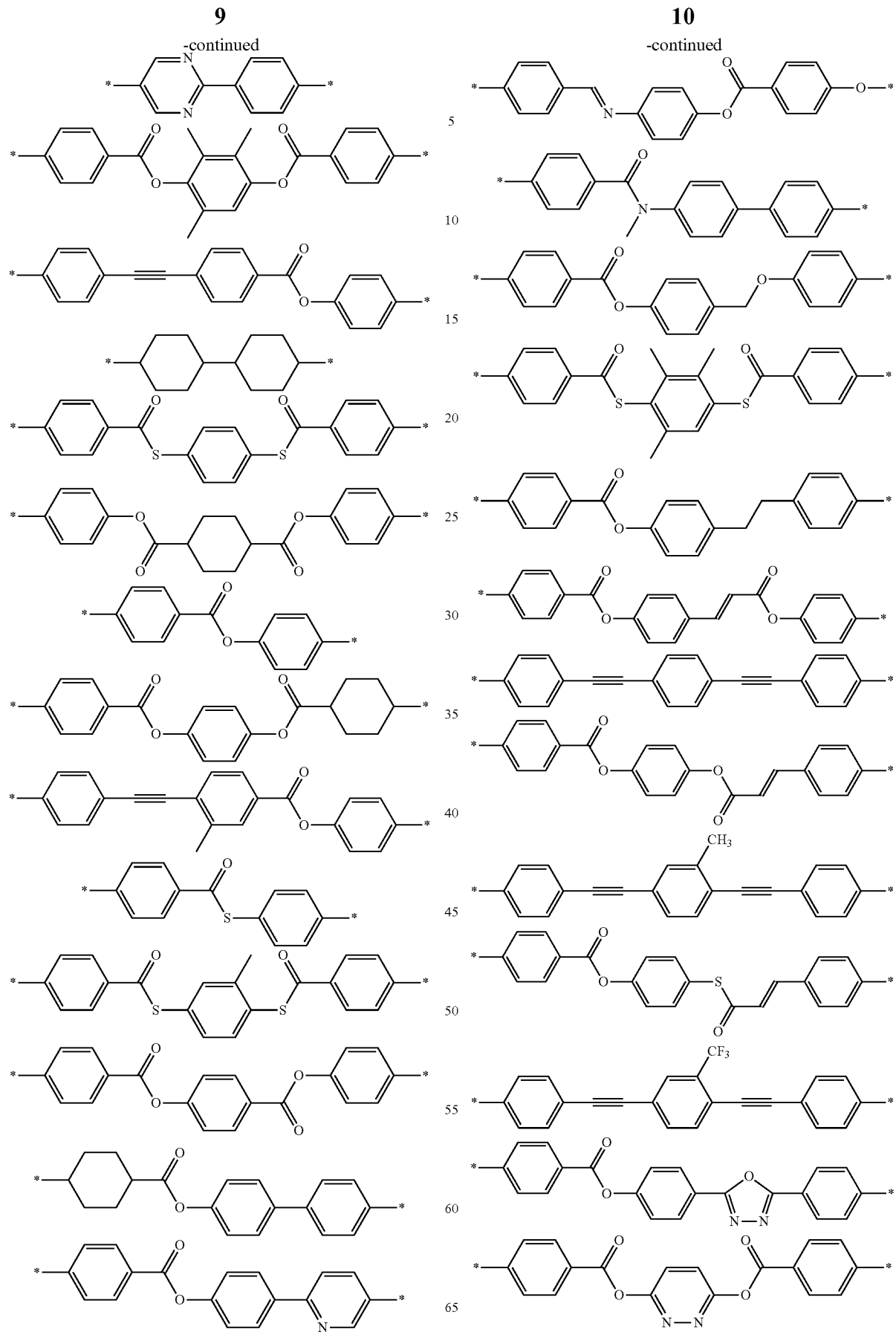

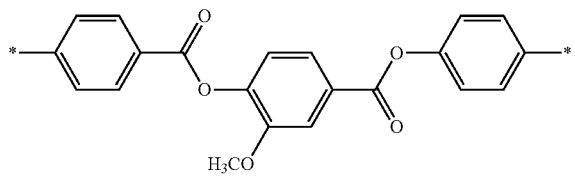
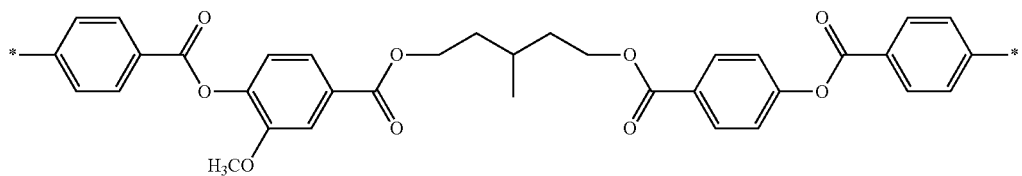
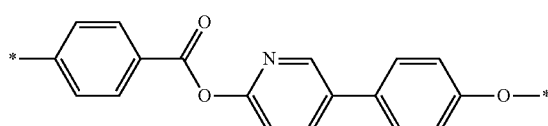
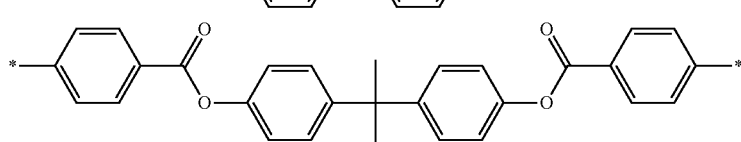
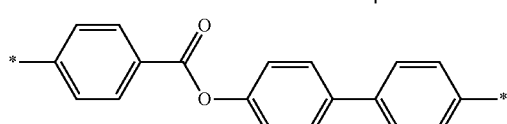
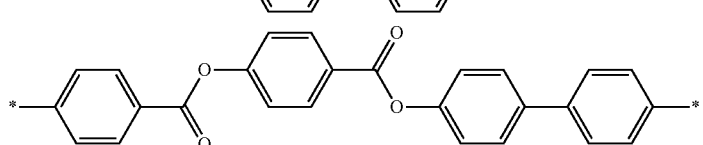
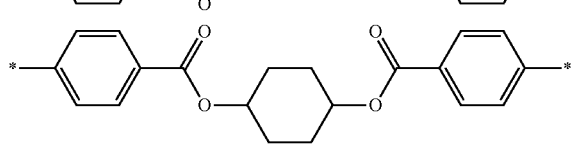
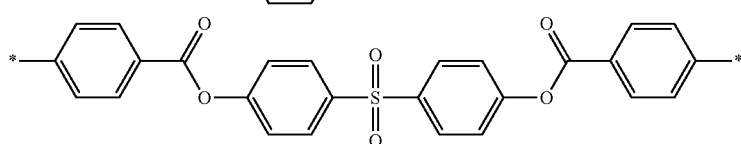
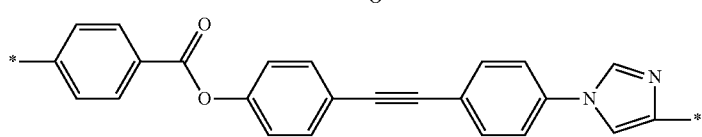
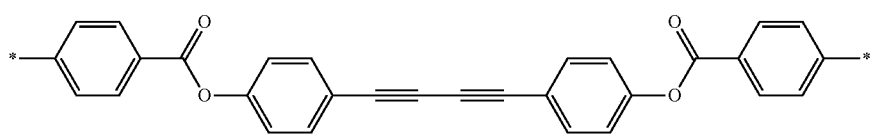
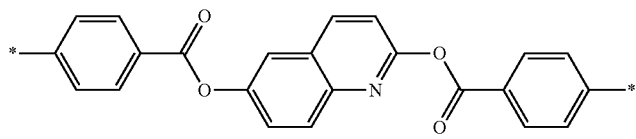
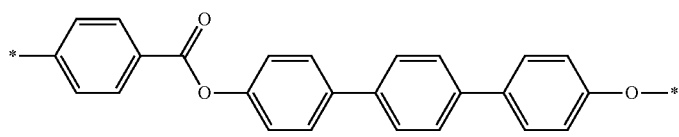

-continued
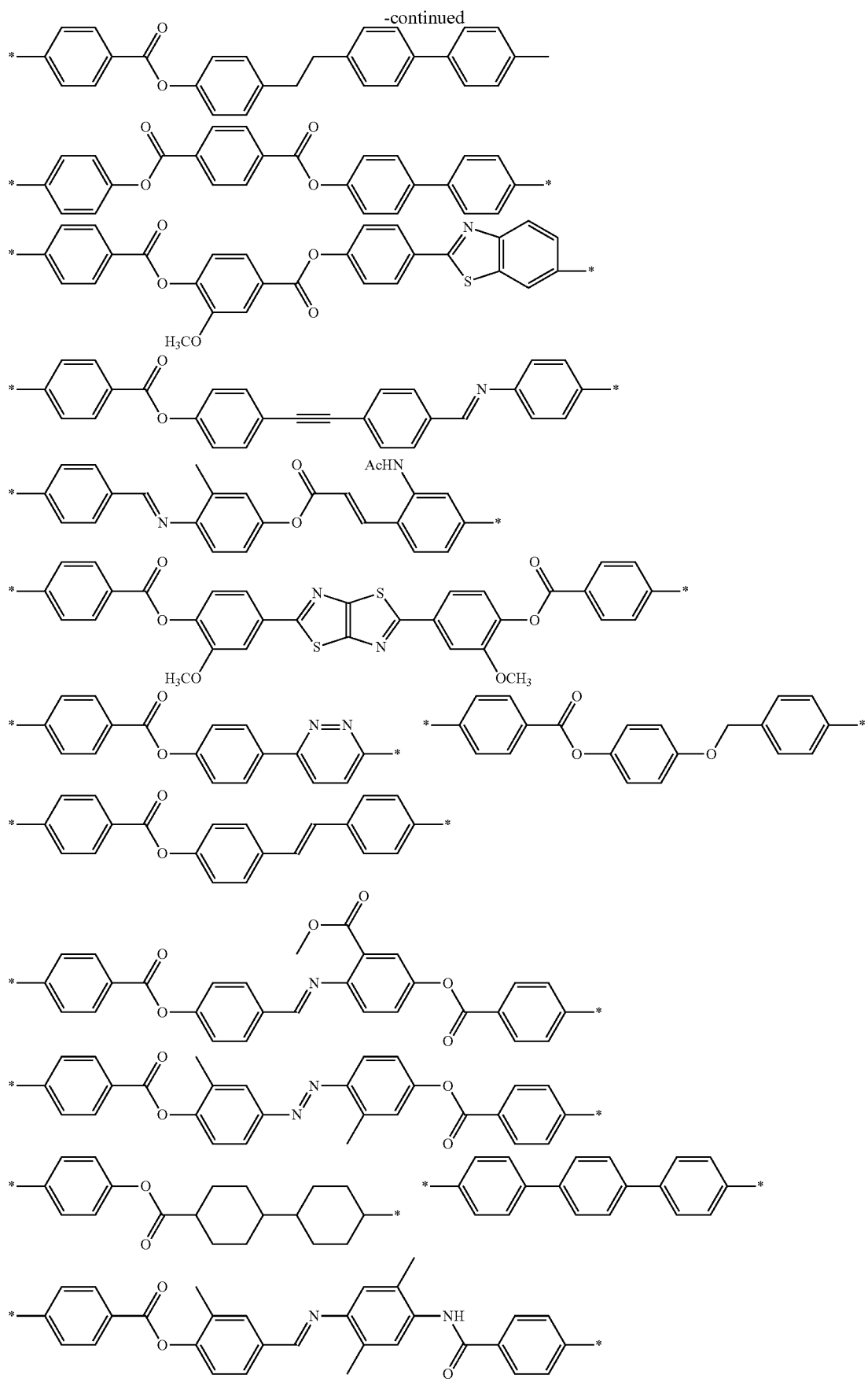

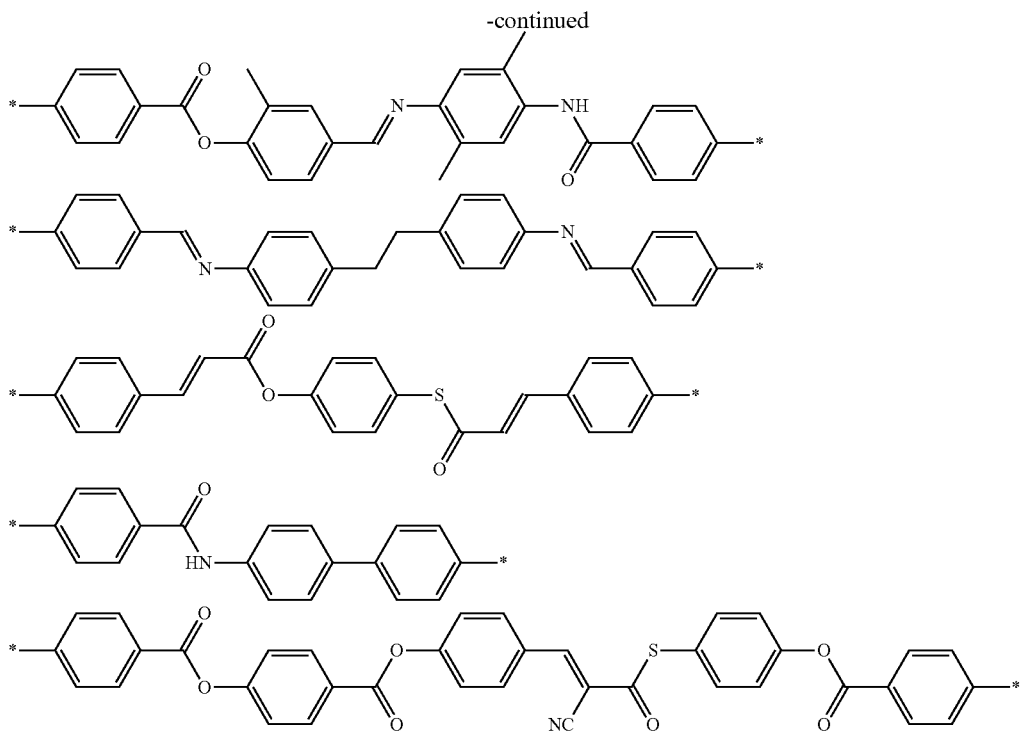

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group (ROC(O)—: R is an alkyl group) having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. T1 may be a group formed by combining two or more of the above groups.

Examples of the (meth)acryloyloxy group-containing group include a group represented by -L-A (L represents a single bond or a linking group, where specific examples of the linking group are the same as those of L1 and SP1 described above, and A represents an (meth)acryloyloxy group).

T1 is preferably an alkoxy group having 1 to 10 carbon atoms, more preferably an alkoxy group having 1 to 5 carbon atoms, and still more preferably a methoxy group, from the viewpoint that the effects of the present invention are more excellent. These terminal groups may be further substituted with these groups or the polymerizable groups described in JP2010-244038A.

The number of atoms in the main chain of T1 is preferably 1 to 20, more preferably 1 to 15, still more preferably 1 to 10, and particularly preferably 1 to 7, from the viewpoint that the effects of the present invention are more excellent. In a case where the number of atoms in the main chain of T1 is 20 or less, the alignment degree of the polarizer is further improved. Here, the "main chain" of T1 means the longest molecular chain bonded to M1, and hydrogen atoms are not counted as the atoms in the main chain of T1. For example, in a case where T1 is an n-butyl group, the main chain has 4 atoms, and in a case where T1 is a sec-butyl group, the main chain has 3 atoms.

The content of the repeating unit (1) is preferably 70% to 98% by mass and more preferably 75% to 95% by mass with respect to the total repeating units (100% by mass) contained in the high-molecular weight liquid crystal compound from the viewpoint that the effects of the present invention are more excellent.

In the present invention, the content of each of the repeating units contained in the high-molecular weight liquid crystal compound is calculated based on the charged amount (mass) of each of the monomers used to obtain each of the repeating units.

The high-molecular weight liquid crystal compound may contain only one kind of repeating unit (1) or may contain two or more kinds thereof. In a case where two or more kinds of repeating units (1) are contained, the content of the repeating unit (1) means the total content of the repeating units (1).

Among the above, it is preferable that two kinds of repeating units (1) are contained in the high-molecular weight liquid crystal compound from the viewpoint that the effects of the present invention are more excellent.

In a case where the high-molecular weight liquid crystal compound contains two kinds of repeating units (1), the terminal group represented by T1 in one kind (a repeating unit A) is preferably an alkoxy group and the terminal group represented by T1 in the other kind (a repeating unit B) is preferably a group other than the alkoxy group, from the viewpoint that the effects of the present invention are more excellent.

The terminal group represented by T1 in the repeating unit B is preferably an alkoxycarbonyl group, a cyano group, or a (meth)acryloyloxy group-containing group, and more preferably an alkoxycarbonyl group or a cyano group, from the viewpoint that the effects of the present invention are more excellent.

<Repeating Unit (2)>

The high-molecular weight liquid crystal compound contained in the liquid crystal composition according to the embodiment of the present invention contains a repeating unit (2) represented by Formula (2).

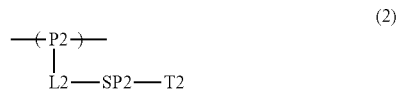

(2)

In Formula (2), P2 represents a main chain of the repeating unit.

in Formula (2), L2 represents a single bond, a divalent alicyclic group which may have a substituent, or a divalent aromatic group which may have a substituent.

In Formula (2), SP2 represents an alkylene group having 10 or more atoms in the main chain. However, one or more pieces of —CH$_2$— constituting an alkylene group represented by SP2 may be substituted with at least one group (hereinafter, also referred to as a "group 2C" selected from the group) consisting of —O—, —S—, —N(R$^{21}$)—, —C(=O)—, —C(=S)—, —C(R$^{22}$)=C(R$^{23}$)—, an alkynylene group, —Si(R$^{24}$)(R$^{25}$)—, —N=N—, —C(R$^{26}$)=N—N=C(R$^{27}$)—, —C(R$^{28}$)=N—, and —S(=O)$_2$—, R$^{21}$ to R$^{28}$ each independently represent a hydrogen atom, a halogen atom, a cyano group, a nitro group or a linear or branched alkyl group having 1 to 10 carbon atoms. In addition, hydrogen atoms contained in the one or more pieces of —CH$_2$-constituting an alkylene group represented by SP2 may be substituted with at least one group (hereinafter, also referred to as a "group 2H") selected from the group consisting of a halogen atom, a cyano group, a nitro group, a hydroxyl group, a linear alkyl group having 1 to 10 carbon atoms, and a branched alkyl groups having 1 to 10 carbon atoms.

In Formula (2), T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an epoxycycloalkyl group, a maleimide group, an oxetanyl group which may have a substituent, or a phenyl group which may have a substituent.

Since specific examples and preferred aspects of P2 are the same as those of P1 of Formula (I), the description thereof will be omitted.

Since specific examples of the divalent alicyclic group represented by L2, where the divalent alicyclic group may have a substituent, are the same as the divalent alicyclic groups described in A1 in Formula (M1-A), the description thereof will be omitted. In addition, examples of the substituent include a substituent W which will be described later, and among them, a fluorine atom, a chlorine atom, an alkyl group, a cyano group, a hydroxy group, a carboxy group, an alkoxy group, a nitro group, an acyloxy group, an amino group, a mercapto group, an alkylthio group, an alkylsulfonyl group, an alkylsulfonylamino group, a sulfo group, an alkylsulfinyl group, or an alkoxycarbonyl group is preferable.

Examples of the divalent aromatic group represented by L2, where the divalent aromatic group may have a substituent, include a divalent aromatic hydrocarbon group and a divalent aromatic heterocyclic group. Specific examples and preferred aspects of the divalent aromatic hydrocarbon group are the same as those of the divalent aromatic hydrocarbon group described in A1 in Formula (M1-A), the description thereof will be omitted. In addition, specific examples and preferred aspects of the divalent aromatic heterocyclic group are the same as those of the divalent aromatic heterocyclic group described in A1 in Formula (M1-A), the description thereof will be omitted. In addition, examples of the substituent include a substituent W which will be described later, and among them, a fluorine atom, a chlorine atom, an alkyl group, a cyano group, a hydroxy group, a carboxy group, an alkoxy group, a nitro group, an acyloxy group, an amino group, a mercapto group, an alkylthio group, an alkylsulfonyl group, an alkylsulfonylamino group, a sulfo group, an alkylsulfinyl group, or an alkoxycarbonyl group is preferable.

L2 is preferably a single bond from the viewpoint that the effects of the present invention are further exhibited.

SP2 represents an alkylene group having 10 or more atoms in the main chain, one or more pieces of —CH$_2$— constituting an alkylene group may be substituted with the above-described group 2C, and hydrogen atoms contained in the one or more pieces of —CH$_2$-constituting an alkylene group may be substituted with the above-described group 2H.

The number of atoms in the main chain of SP2 is 10 or more, and from the point that a light absorption anisotropic film excellent in at least one property of adhesiveness or plane shape uniformity can be obtained, preferably 15 or more and more preferably 19 or more. The upper limit of the number of atoms in the main chain of SP2 is preferably 70 or less, more preferably 60 or less, and particularly preferably 50 or less, from the viewpoint that a light absorption anisotropic film more excellent in alignment degree can be obtained.

Here, the "main chain" in SP2 means a partial structure required for directly linking L2 and T2, and the "number of atoms in the main chain" means the number of atoms constituting the partial structure. In other words, the "main chain" in SP2 is a partial structure in which the number of atoms linking L2 and T2 is the smallest. For example, in a case where SP2 is a 3,7-dimethyldecanyl group, the number of atoms in the main chain is 10, and in a case where SP2 is a 4,6-dimethyldodecanyl group, the number of atoms in the main chain is 12. Further, in Formula (2-1), the inside of the frame represented by the dotted quadrangle corresponds to SP2, and the number of atoms (corresponding to the total number of atoms circled by the dotted line) in the main chain of SP2 is 11.

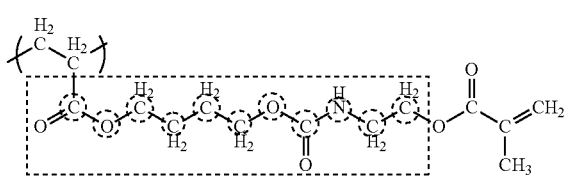

(2-1)

The alkylene group represented by SP2 may be linear or branched.

The number of carbon atoms of the alkylene group represented by SP2 is preferably 8 to 80, more preferably 15 to 80, still more preferably 25 to 70, and particularly preferably 25 to 60, from the viewpoint that a light absorption anisotropic film more excellent in alignment degree can be obtained.

One or more pieces of —$CH_2$— constituting an alkylene group represented by SP2 is preferably substituted with the above-described group 2C, from the viewpoint that a light absorption anisotropic film excellent in adhesiveness and plane shape uniformity can be obtained.

Further, in a case where a plurality of pieces of —$CH_2$— constituting an alkylene group represented by SP2 are present, only a part of the plurality of pieces of —$CH_2$— are preferably substituted with the group 2C from the viewpoint that a light absorption anisotropic film excellent in adhesiveness and plane shape uniformity can be obtained.

As described above, the group 2C is at least one group selected from the group consisting of —O—, —S—, —N($R^{21}$)—, —C(=O)—, —C(=S)—, —C($R^{22}$)=C($R^{23}$)—, an alkynylene group, —Si($R^{24}$)($R^{25}$)—, —N=N—, —C($R^{26}$)=N—N=C($R^{27}$)—, —C($R^{28}$)=N—, and —S(=O)$_2$—, and from the viewpoint that a light absorption anisotropic film excellent in adhesiveness and plane shape uniformity can be obtained, preferably at least one group selected from the group consisting of —O—, —N($R^{21}$)—, —C(=O)—, and —S(=O)$_2$—, and more preferably at least one group selected from the group consisting of —O—, —N($R^{21}$)—, and —C(=O)—.

In particular, SP2 is preferably a group containing at least one selected from the group consisting of an oxyalkylene structure in which one or more pieces of —$CH_2$— constituting an alkylene group is substituted with —O—, an ester structure in which one or more pieces of —$CH_2$—$CH_2$— constituting an alkylene group is substituted with —O— and —C(=O)—, and an urethane bond in which one or more pieces of —$CH_2$—$CH_2$—$CH_2$— constituting an alkylene group is substituted with —O—, —C(=O)—, and —NH—.

Hydrogen atoms contained in the one or more pieces of —$CH_2$— constituting an alkylene group represented by SP2 may be substituted with the above-described group 2H. In this case, it is sufficient that one or more hydrogen atoms contained in —$CH_2$— are substituted with the group 2H. That is, only one hydrogen atom contained in —$CH_2$— may be substituted with the group 2H, or all (two) hydrogen atoms contained in —$CH_2$— may be substituted with the group 2H.

As described above, the group 2H is at least one group selected from the group consisting of a halogen atom, a cyano group, a nitro group, a hydroxyl group, a linear alkyl group having 1 to 10 carbon atoms, and a branched alkyl group having 1 to 10 carbon atoms, more preferably at least one group selected from the group consisting of a hydroxyl group, a linear alkyl group having 1 to 10 carbon atoms, and a branched alkyl group having 1 to 10 carbon atoms, and more preferably a hydroxyl group.

As described above, T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an epoxycycloalkyl group, a maleimide group, an oxetanyl group which may have a substituent, or a phenyl group which may have a substituent.

The number of carbon atoms in the cycloalkyl group moiety of the epoxycycloalkyl group is preferably 3 to 15, more preferably 5 to 12, still more preferably 5 to 8, and particularly preferably 6 (that is, a case where the epoxycycloalkyl group is an epoxycyclohexyl group), from the viewpoint that the effects of the present invention are more excellent.

Examples of the substituent of the oxetanyl group include an alkyl group having 1 to 10 carbon atoms, and from the viewpoint that the effects of the present invention are more excellent, an alkyl group having 1 to 5 carbon atoms is preferable. The alkyl group as a substituent of the oxetanyl group may be linear or branched; however, it is preferably linear from the viewpoint that the effects of the present invention are more excellent.

Examples of the substituent of the phenyl group include a boronic acid group, a sulfonic acid group, a vinyl group, an amino group, and from the viewpoint that the effects of the present invention are more excellent, more preferably a boronic acid group.

Among these, from the viewpoint of improving adhesiveness by crosslinking and/or by an interaction with an underlying layer (for example, a base material or an alignment film), T2 is preferably a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an epoxycycloalkyl group, a maleimide group, or an oxetanyl group which may have a substituent; and from the viewpoint of further improving adhesiveness due to the result that the cohesion destruction of the light absorption anisotropic film can be suppressed by crosslinking the light absorption anisotropic film itself, T2 is more preferably a vinyl group, an acryloyloxy group, a methacryloyloxy group, an epoxy group, an epoxycycloalkyl group, a maleimide group, or an oxetanyl group which may have a substituent.

Specific examples of the repeating unit (2) include the following structures. In the following specific example, n1 represents an integer of 2 or more, and n2 represents an integer of 1 or more.

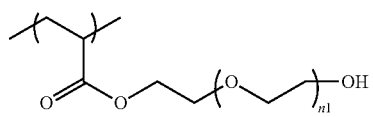

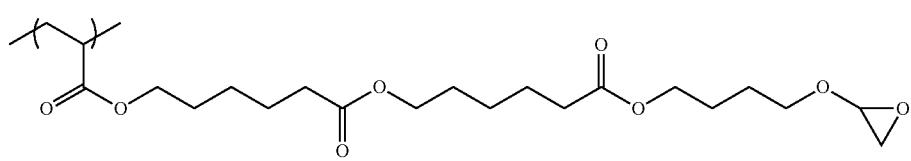

-continued

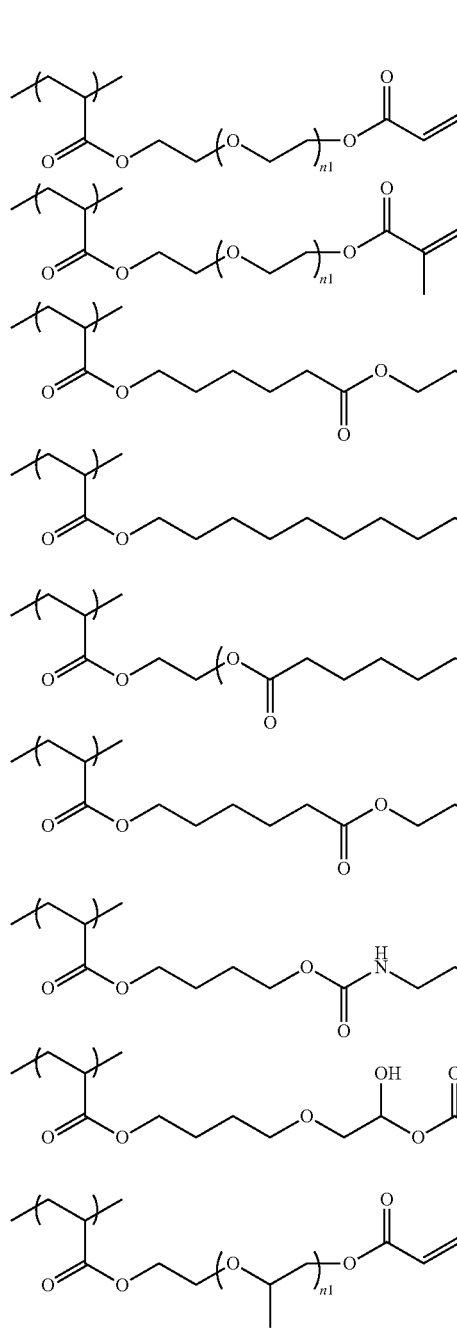
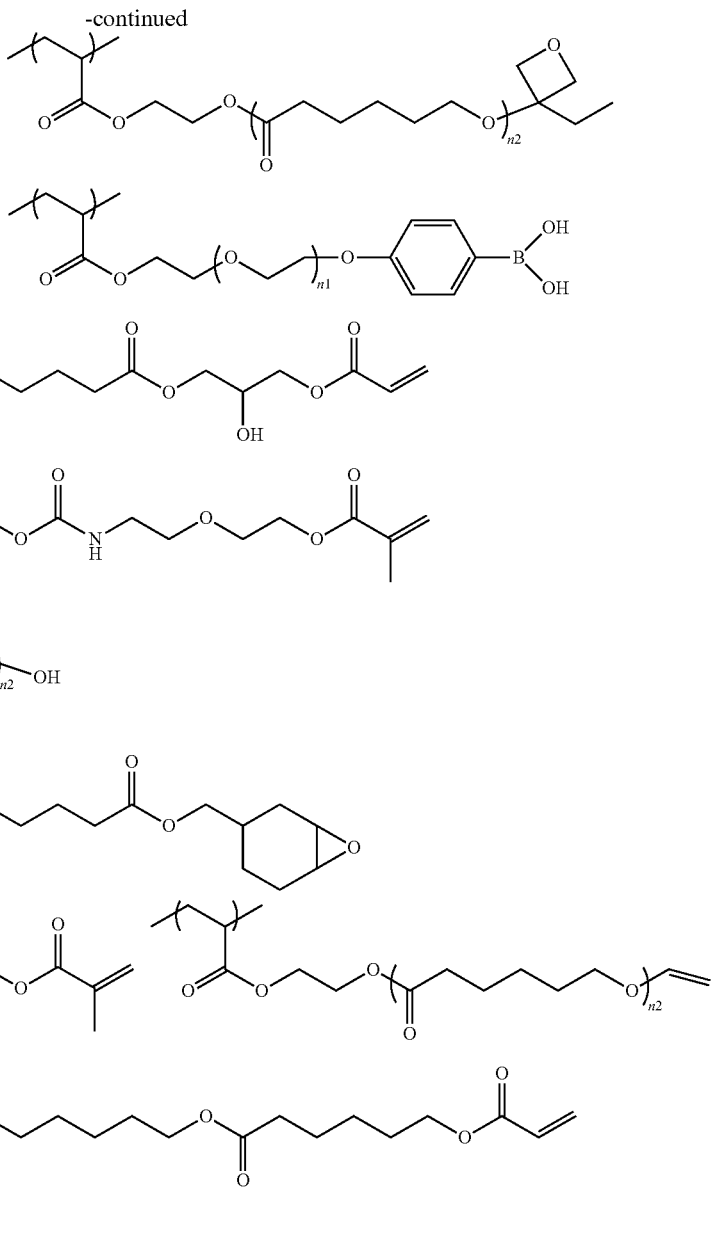

The content of the repeating unit (2) is preferably 4% to 20% by mass and more preferably 6% to 18% by mass with respect to the total repeating units (100% by mass) contained in the high-molecular weight liquid crystal compound. In a case where the content of the repeating unit (2) is 4% by mass or more, a light absorption anisotropic film excellent in adhesiveness can be obtained. In addition, in a case where the content of the repeating unit (2) is 20% by mass or less, a light absorption anisotropic film excellent in plane shape uniformity can be obtained.

The high-molecular weight liquid crystal compound may contain only one kind of repeating unit (2) or two or more kinds of repeating units (2). In a case where two or more kinds of repeating units (2) are contained, the content of the repeating unit (2) means the total content of the repeating units (2).

In the high-molecular weight liquid crystal compound, the mass ratio of the repeating unit (1) to the repeating unit (2) (the content of the repeating unit (1)/the content of the repeating unit (2)) is preferably 1.25 to 99.0, more preferably 2.16 to 49.5, and particularly preferably 3.50 to 32.7, from the viewpoint that the effects of the present invention are more excellent.

<Substituent W>

The substituent W in the present specification is described.

Examples of the substituent W include a halogen atom, an alkyl group (for example, a tert-butyl group)(including a cycloalkyl group, a bicycloalkyl group, and a tricycloalkyl group), and an alkenyl group (including a cycloalkenyl group and a bicycloalkenyl group).), an alkynyl group, an aryl group, a heterocyclic group (may also be referred to as heterocyclic ring), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, a acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, an ureide group, a boronic acid group (—B(OH)$_2$), a phosphato group (—OPO(OH)$_2$), a sulfato group (—OSO$_3$H), and other known substituents.

The details of the substituent are described in paragraph [0023] of JP2007-234651A.

<Physical Properties>

The weight-average molecular weight (Mw) of the high-molecular weight liquid crystal compound is preferably 1,000 to 500,000, and more preferably 2,000 to 300,000 from the viewpoint that the effects of the present invention are more excellent. In a case where Mw of the high-molecular weight liquid crystal compound is within the above range, the high-molecular weight liquid crystal compound is easily handled.

Particularly, from the viewpoint of suppressing cracking at the time of coating, the weight-average molecular weight (Mw) of the high-molecular weight liquid crystal compound is preferably 10,000 or more and more preferably 10,000 to 300,000.

From the viewpoint of the temperature latitude of the alignment degree, the weight-average molecular weight (Mw) of the high-molecular weight liquid crystal compound is preferably less than 10,000 and more preferably 2,000 or more and less than 10,000.

Here, in the present invention, the weight-average molecular weight and the number-average molecular weight are values measured by gel permeation chromatography (GPC).

Solvent (eluent): N-methylpyrrolidone
Device name: TOSOH HLC-8220GPC
Column: TOSOH TSK gel Super AWM-H (6 mm×15 cm) (three columns are connected and used)
Column temperature: 25° C.
Sample concentration: 0.1% by mass
Flow rate: 0.35 mL/min
Calibration curve: A calibration curve obtained using seven TSK standard polystyrene samples, manufactured by TOSOH Corporation, in a range of Mw=2,800,000 to 1,050 (Mw/Mn=1.03 to 1.06) is used.

The high-molecular weight liquid crystal compound may exhibit any liquid crystallinity of nematic liquid crystallinity or smectic liquid crystallinity; however, the high-molecular weight liquid crystal compound preferably exhibits at least nematic liquid crystallinity.

The temperature range in which a nematic phase is presented is preferably room temperature 23° C. to 450° C. and is more preferably 50° C. to 400° C. from the viewpoint of handling and manufacturing suitability.

<Dichroic Substance>

The dichroic substance contained in the liquid crystal composition according to the embodiment of the present invention is not particularly limited, and examples thereof include a visible light-absorbing substance (a dichroic dye), a luminescent substance (a fluorescent substance, a phosphorescent substance, or the like), an ultraviolet light-absorbing substance, an infrared light-absorbing substance, a nonlinear optical substance, a carbon nanotube, and an inorganic substance (for example, a quantum rod), and a conventionally known dichroic substance (a dichroic dye) can be used.

Specific examples of the dichroic substance include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic substances may be used in combination. For example, from the viewpoint of making the color of the polarizer close to black, at least one kind of dichroic substance having a maximum absorption wavelength in a wavelength range of 370 to 550 nm and at least one kind of dichroic substance having a maximum absorption wavelength in a wavelength range of 500 to 700 nm are preferably used in combination.

The dichroic substance may have a crosslinkable group. Specific examples of the crosslinkable group include a (meth)acryloyl group, an epoxy group, an oxetanyl group, and a styryl group, and among these, a (meth)acryloyl group is preferable.

The content of the dichroic substance is preferably 1 to 400 parts by mass, more preferably 2 to 100 parts by mass, and particularly preferably 5 to 30 parts by mass, with respect to 100 parts by mass of the high-molecular weight liquid crystal compound from the viewpoint that the effects of the present invention are more excellent.

In a case where two or more kinds of dichroic substances are contained, the content of the dichroic substance means the total content of the dichroic substances.

[Polymerization Initiator]

The liquid crystal composition according to the embodiment of the present invention preferably contains a polymerization initiator.

The polymerization initiator is not particularly limited; however, a photosensitive compound, that is, a photopolymerization initiator is preferable.

As the photopolymerization initiator, various kinds of compounds can be used without particular limitations. Examples of the photopolymerization initiator include α-carbonyl compounds (the specifications of U.S. Pat. Nos. 2,367,661A and 2,367,670A), an acyloin ether (the specification of U.S. Pat. No. 2,448,828A), an aromatic acyloin compound substituted with α-hydrocarbon (the specification of U.S. Pat. No. 2,722,512A), polynuclear quinone compounds (the specifications of U.S. Pat. Nos. 3,046,127A and 2,951,758A), a combinations of a triarylimidazole dimer and a p-aminophenyl ketone (the specification of U.S. Pat. No. 3,549,367A), acridine and a phenazine compound (the specifications of JP1985-105667A (JP-S60-105667A) and U.S. Pat. No. 4,239,850A), an oxadiazole compound (the specification of U.S. Pat. No. 4,212,970A), and acylphosphine oxide compounds (JP1988-040799B (JP-S63-040799B), JP1993-029234B (JP-H5-029234B), JP1998-095788A (JP-H10-095788A), and JP1998-029997A (JP-H10-029997A)).

As such a photopolymerization initiator, a commercially available product can also be used, and examples thereof include IRGACURE 184, 907, 369, 651, 819, OXE-01, and OXE-02, which are manufactured by BASF SE.

In a case where the liquid crystal composition according to the embodiment of the present invention contains a polymerization initiator, the content of the polymerization initiator is preferably 0.01 to 30 parts by mass, and more preferably 0.1 to 15 parts by mass with respect to a total of 100 parts by mass of the dichroic substance and the high-molecular weight liquid crystal compound in the liquid crystal composition. In a case where the content of the polymerization initiator is 0.01 parts by mass or more, the durability of a light absorption anisotropic film is improved, and in a case where the content of the polymerization initiator is 30 parts by mass or less, the alignment of a light absorption anisotropic film is improved.

The polymerization initiator may be contained alone or two or more thereof may be contained. In a case where two or more kinds of polymerization initiators are contained, the content of the polymerization initiator means the total content of the polymerization initiators.

[Solvent]

From the viewpoint of workability and the like, the liquid crystal composition according to the embodiment of the present invention preferably contains a solvent.

Examples of the solvent include organic solvents such as ketones (for example, acetone, 2-butanone, methyl isobutyl ketone, cyclopentanone, and cyclohexanone), ethers (for example, dioxane, tetrahydrofuran, 2-methyltetrahydrofuran, cyclopentyl methyl ether, tetrahydropyran, and dioxolan), aliphatic hydrocarbons (for example, hexane), alicyclic hydrocarbons (for example, cyclohexane), aromatic hydrocarbons (for example, benzene, toluene, xylene, and trimethyl benzene), halocarbons (for example, dichloromethane, trichloromethane, dichloroethane, dichlorobenzene, and chlorotoluene), esters (for example, methyl acetate, ethyl acetate, butyl acetate, and ethyl lactate), alcohols (for example, ethanol, isopropanol, butanol, cyclohexanol, isopentyl alcohol, neopentyl alcohol, diacetone alcohol, and benzyl alcohol), cellosolves (for example, methyl cellosolve, ethyl cellosolve, and 1,2-dimethoxyethane), cellosolve acetates, sulfoxides (for example, dimethylsulfoxide), amides (for example, dimethylformamide, dimethylacetamide, N-methylpyrrolidone, and N-ethylpyrrolidone), and heterocyclic compounds (for example, pyridine), and water. These solvents may be used alone, or two or more thereof may be used in combination.

Among these solvents, ketones (particularly, cyclopentanone and cyclohexanone), ethers (particularly, tetrahydrofuran, cyclopentyl methyl ether, tetrahydropyran, and dioxolan), or amides (particularly, dimethylformamide, dimethylacetamide, N-methylpyrrolidone, and N-ethylpyrrolidone) are preferable from the viewpoint of utilizing the effect that the solubility is excellent.

In a case where the liquid crystal composition according to the embodiment of the present invention contains a solvent, the content of the solvent is preferably 80% to 99% by mass, more preferably 83% to 98% by mass, and still more preferably 85% to 96% by mass with respect to the total mass of the liquid crystal composition.

In a case where two or more kinds of solvents are contained, the content of the solvent means the total content of the solvents.

[Interface Improver]

The liquid crystal composition according to the embodiment of the present invention preferably contains an interface improver. In a case where an interface improver is contained, it is expected that the smoothness of the coating surface is improved, whereby the alignment degree is improved, or that cissing and unevenness are suppressed, whereby in-plane uniformity is improved.

As the interface improver, a material making the liquid crystal compound horizontal on the coating surface side is preferable, and the compounds (horizontal alignment agents) described in paragraphs [0253] to [0293] of JP2011-237513A can be used. The fluorine (meth)acrylate-based polymers described in paragraphs [0018] to [0043] of JP2007-272185A and the like can also be used. Other compounds may also be used as the interface improver.

In a case where the liquid crystal composition according to the embodiment of the present invention contains an interface improver, the content of the interface improver is preferably 0.001 to 5 parts by mass and more preferably 0.01 to 3 parts by mass with respect to a total of 100 parts by mass of the dichroic substance and the high-molecular weight liquid crystal compound in the liquid crystal composition.

The interface improver may be contained alone, or two or more thereof may be contained. In a case where two or more kinds of interface improvers are contained, the content of the interface improver means the total content of the interface improvers.

[Light Absorption Anisotropic Film]

The light absorption anisotropic film according to the embodiment of the present invention is a light absorption anisotropic film that is formed from the above-described liquid crystal composition according to the embodiment of the present invention.

Examples of the method of manufacturing the light absorption anisotropic film according to the embodiment of the present invention include a method including, in order, a step of forming a coating film by applying the liquid crystal composition to a base material (hereinafter, also referred to as "coating film forming step") and a step of aligning a dichroic substance contained in the coating film (hereinafter, also referred to as "alignment step").

Hereinafter, each of the steps of the method of manufacturing the light absorption anisotropic film according to the embodiment of the present invention will be described.

[Coating Film Forming Step]

The coating film forming step is a step of forming a coating film by coating a base material with the liquid crystal composition.

In a case where a liquid crystal composition containing the above-described solvent is used, or a liquid material such as a molten liquid obtained by heating the liquid crystal composition is used, a base material is easily coated with the liquid crystal composition.

Examples of the method of applying the liquid crystal composition include known methods such as a roll coating method, a gravure printing method, a spin coating method, a wire bar coating method, an extrusion coating method, a direct gravure coating method, a reverse gravure coating method, a die coating method, a spray method, and an ink jet method.

In the present aspect, an example in which a base material is coated with the liquid crystal composition has been described; however, the examples are not limited thereto. For example, an alignment film provided on the base material may be coated with the liquid crystal composition. Details of the base material and the alignment film will be described later.

[Alignment Step]

The alignment step is a step of aligning a dichroic substance contained in the coating film. Through this step, a light absorption anisotropic film is obtained.

The alignment step may include a drying treatment. In a case where drying treatment is carried out, a component such as a solvent can be removed from the coating film. The drying treatment may be carried out by a method of leaving the coating film for a predetermined time at room temperature (for example, natural drying) or by a method of carrying out heating and/or air blowing.

Here, the dichroic substance contained in the liquid crystal composition tends to be aligned by the above-described coating film forming step or drying treatment. For example, in an aspect in which the liquid crystal composition is prepared as a coating liquid containing a solvent, the coating film is dried to remove the solvent from the coating film, whereby a coating film (that is, light absorption anisotropic film) having light absorption anisotropy is obtained.

The alignment step preferably has a heating treatment. Accordingly, the dichroic substance contained in the coating film can be aligned, and thus the coating film after the heating treatment can be preferably used as a light absorption anisotropic film.

The heating treatment is preferably carried out at 10° C. to 250° C. and more preferably at 25° C. to 190° C. in terms of manufacturing suitability or the like. The heating time is preferably 1 to 300 seconds and more preferably 1 to 60 seconds.

The alignment step may have a cooling treatment that is carried out after the heating treatment. The cooling treatment is a treatment for cooling the coating film after the heating to about 20° C. to 25° C. of room temperature. Accordingly, the alignment of the dichroic substance contained in the coating film can be fixed. The cooling means is not particularly limited, and the cooling can be carried out by a conventionally known method.

By the above steps, a light absorption anisotropic film can be obtained.

In the present aspect, examples of the method of aligning the dichroic substance contained in the coating film include the drying treatment and the heating treatment; however, the examples are not limited thereto, and a conventionally known alignment treatment can be used.

[Other Steps]

The method of manufacturing a light absorption anisotropic film may have a step of curing the light absorption anisotropic film (hereinafter, also referred to as a "curing step") after the alignment step.

For example, the curing step is carried out by heating and/or light irradiation (exposure). Among the above, light irradiation is preferably carried out to carrying out the curing step.

As the light source that is used for curing, various light sources such as infrared rays, visible light, and ultraviolet rays can be used, and ultraviolet rays are preferable. At the time of curing, ultraviolet rays may be applied while heating or may be applied through a filter that transmits only a specific wavelength.

In addition, the exposure may be carried out under a nitrogen atmosphere. In a case where the light absorption anisotropic film is cured by radical polymerization, the inhibition of polymerization by oxygen is reduced, and thus the exposure is preferably carried out under a nitrogen atmosphere.

The film thickness of the light absorption anisotropic film is preferably 0.1 to 5.0 µm, and more preferably 0.3 to 1.5 µm. Although the film thickness depends on the concentration of the dichroic substance in the liquid crystal composition, a light absorption anisotropic film having an excellent absorbance is obtained in a case where the film thickness is 0.1 µm or more, and a light absorption anisotropic film having an excellent transmittance is obtained in a case where the film thickness is 5.0 µm or less.

[Laminate]

A laminate according to the embodiment of the present invention has a base material and the light absorption anisotropic film according to the embodiment of the present invention formed on the base material.

The laminate according to the embodiment of the present invention may further have a λ/4 plate formed on the light absorption anisotropic film.

In addition, the laminate according to the embodiment of the present invention may have an alignment film between the base material and the light absorption anisotropic film.

The laminate according to the embodiment of the present invention may further have a barrier layer between the light absorption anisotropic film and the V/4 plate.

Hereinafter, the constituent layers of the laminate according to the embodiment of the present invention will be described.

[Base Material]

The base material can be selected depending on the usage of the light absorption anisotropic film, and examples thereof include glass and a polymer film. The light transmittance of the base material is preferably 80% or more.

In a case where a polymer film is used as the base material, an optically isotropic polymer film is preferably used. As specific examples and preferred aspects of the polymer, those described in paragraph [0013] of JP2002-022942A can be applied. In addition, even a conventionally known polymer such as polycarbonate or polysulfone in which birefringence is easily developed can also be used by reducing the developability through molecular modification described in WO2000/026705A.

[Light Absorption Anisotropic Film]

Since the light absorption anisotropic film is as described above, the description thereof will be omitted.

[λ/4 Plate]

The "λ/4 plate" is a plate having a λ/4 function, and is specifically, a plate having a function of converting linearly polarized light with a specific wavelength into circularly polarized light (or converting circularly polarized light into linearly polarized light).

For example, in an aspect in which the λ/4 plate has a single layer structure, specific examples of the plate include a retardation film in which an optically anisotropic layer having a λ/4 function is provided on a stretched polymer film or a support. In another aspect in which the λ/4 plate has a multilayered structure, specific examples of the plate include a broadband λ/4 plate obtained by laminating a λ/4 plate and a λ/2 plate.

The λ/4 plate and the light absorption anisotropic film may be provided to be in contact with each other, or another layer may be provided between the λ/4 plate and the light absorption anisotropic film. Examples of the layer include a pressure-sensitive adhesive layer or an adhesive layer for securing adhesiveness, and a barrier layer.

[Barrier Layer]

In a case where the laminate according to the embodiment of the present invention has a barrier layer, the barrier layer is provided between the light absorption anisotropic film and the λ/4 plate. In a case where a layer other than the barrier layer (for example, a pressure-sensitive adhesive layer or an adhesive layer) is provided between the light absorption anisotropic film and the a/4 plate, the barrier layer can be provided between, for example, the light absorption anisotropic film and the above layer other than the barrier layer.

The barrier layer is also called a gas barrier layer (an oxygen barrier layer) and has the function of protecting a light absorption anisotropic film from a gas such as oxygen in the atmosphere, moisture, or a compound contained in the adjacent layer.

Regarding the barrier layer, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] of JP2005-169994A can be referred to.

[Alignment Film]

The laminate according to the embodiment of the present invention may have an alignment film between the base material and the light absorption anisotropic film.

As the alignment film, any layer may be used as long as it allows the dichroic substance contained in the liquid crystal composition according to the embodiment of the present invention to have a desired alignment state on the alignment film.

The alignment film can be provided by means of a rubbing treatment on the film surface with an organic compound (preferably a polymer), oblique vapor deposition of an inorganic compound, forming a layer having microgrooves, or accumulation of an organic compound (for example, ω-tricosanoic acid, dioctadecylnethylammonium chloride or methyl stearate) by the Langmure-Blogette method (LB film). Furthermore, there has been also known an alignment film having an aligning function that is imparted by applying an electrical field, applying a magnetic field, or by irradiation with light. In the present invention, among these, an alignment film formed by a rubbing treatment is preferable in terms of easy control of a pretilt angle of the alignment film, and an optical alignment film formed by irradiation with light is also preferable in terms of alignment uniformity.

<Rubbing Treated Alignment Film>

The polymer material used for an alignment film formed by a rubbing treatment is described in many documents, and many commercially available products are available. In the present invention, polyvinyl alcohol or polyimide, or a derivative thereof can be preferably used. Regarding the alignment film, the description in the 24th line on page 43 to the 8th line on page 49 in WO2001/088574A1 can be referred to. The thickness of the alignment film is preferably 0.01 to 10 μm and more preferably 0.01 to 1 μm.

<Optical Alignment Film>

The optical alignment material used for an alignment film formed by irradiation with light is described in many documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignable units described in JP2002-265541A and JP2002-317013A, photo-crosslinkable silane derivatives described in JP4205195B and JP4205198B, and photo-crosslinkable polyimides, polyamides, and esters described in JP2003-520878A, JP2004-529220A, and JP4162850B. Azo compounds, photo-crosslinkable polyimides, polyamides, or esters are more preferable.

To an optical alignment film formed from the above-described material, linearly polarized light or non-polarized light is applied to manufacture an optical alignment film.

In this specification, the "linearly polarized light irradiation" and the "non-polarized light irradiation" are operations for causing a photoreaction to the optical alignment material. The wavelength of the light used varies depending on the optical alignment material used and is not particularly limited as long as the wavelength is a wavelength necessary for the photoreaction. The peak wavelength of the light used for light irradiation is preferably 200 nm to 700 run, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and a YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or diagonal from the alignment film surface is employed. Although the incidence angle of the light varies depending on the optical alignment material, the incidence angle is preferably 0° to 90° (vertical) and more preferably 40° to 90°.

In a case where non-polarized light is used, the alignment film is irradiated with non-polarized light from a diagonal direction. The incidence angle of the light is preferably 10° to 80°, more preferably 20° to 60°, and still more preferably 30° to 50°. The irradiation time is preferably 1 minute to 60 minutes and more preferably 1 minute to 10 minutes.

In a case where patterning is required, a method of carrying out light irradiation using a photomask as many times as necessary for pattern formation, or a pattern writing method using laser beam scanning can be employed.

[Usage]

The laminate according to the embodiment of the present invention can be used as a polarizing element (polarizing plate). For example, it can be used as a linearly polarizing plate or a circularly polarizing plate.

In a case where the laminate according to the embodiment of the present invention has no optically anisotropic layer such as the λ/4 plate, the laminate can be used as a linearly polarizing plate.

In a case where the laminate according to the embodiment of the present invention has the λ/4 plate, the laminate can be used as a circularly polarizing plate.

[Image Display Device]

An image display device according to the embodiment of the present invention has the above-described light absorption anisotropic film or the above-described laminate.

The display element used for the image display device according to the embodiment of the present invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the present invention, a liquid crystal display device using a liquid crystal cell as a display element, or an organic EL display device using an organic EL display panel as a display element is preferable, and a liquid crystal display device is more preferable.

[Liquid Crystal Display Device]

A liquid crystal display device as an example of the image display device according to the embodiment of the present invention preferably has an aspect in which it has the above-described light absorption anisotropic film and a liquid crystal cell. More preferably, the liquid crystal display device has the above-described laminate (but including no λ/4 plate) and a liquid crystal cell.

In the present invention, it is preferable that the light absorption anisotropic film (laminate) according to the embodiment of the present invention be used as a polarizing element on the front side among light absorption anisotropic films (laminates) to be provided on both sides of a liquid crystal cell, and it is more preferable that the light absorption anisotropic film (laminate) according to the embodiment of the present invention be used as polarizing elements on the front side and the rear side.

Hereinafter, the liquid crystal cell of the liquid crystal display device will be described in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode; however, the liquid crystal cell is not limited thereto.

In a TN mode liquid crystal cell, without the application of a voltage, rod-like liquid crystalline molecules are substantially horizontally aligned, and twist-aligned by 60° to 120°. The TN mode liquid crystal cell is most frequently used as a color thin film transistor (TFT) liquid crystal display device and is described in many documents.

In a VA mode liquid crystal cell, rod-like liquid crystalline molecules are substantially vertically aligned without the application of a voltage. The VA mode liquid crystal cell includes (1) a narrowly-defined VA mode liquid crystal cell in which rod-like liquid crystalline molecules are substantially vertically aligned without the application of a voltage, and are substantially horizontally aligned with the application of a voltage (described in JP1990-176625A (JP-H2-176625A)), (2) an MVA mode liquid crystal cell in which the VA mode is made into multi-domains in order to expand the viewing angle (described in SID97, Digest of tech. Papers (proceedings) 28 (1997) 845), (3) an n-ASM mode liquid crystal cell in which rod-like liquid crystalline molecules are substantially vertically aligned without the application of a voltage and are twisted and aligned in multi-domains with the application of a voltage (described in the proceedings 58 and 59 of Japanese Liquid Crystal Symposium (1998)), and (4) a SURVIVAL mode liquid crystal cell (announced at LCD International 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. Methods of improving the viewing angle by reducing light leakage caused when a black image is displayed in a diagonal direction using an optical compensation sheet is disclosed by JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

An organic EL display device as an example of the image display device according to the embodiment of the present invention preferably has an aspect in which it has a light absorption anisotropic film, a λ/4 plate, and an organic EL display panel in this order from the visual recognition side.

More preferably, the organic EL display device has the above-described laminate having a λ/4 plate and an organic EL display panel in this order from the visual recognition side. In this case, the laminate has a base material, an alignment film to be provided as necessary, a light absorption anisotropic film, a barrier layer to be provided as necessary, and a λ/4 plate disposed in this order from the visual recognition side.

In addition, the organic EL display panel is a display panel having a configuration using an organic EL element in which an organic light emitting layer (organic electroluminescence layer) is interposed between electrodes (between a cathode and an anode). The configuration of the organic EL display panel is not particularly limited, and a conventionally known configuration is employed.

EXAMPLES

Hereinafter, the present invention will be described in more detail based on Examples. Materials, used amounts, ratios, treatment contents, treatment procedures, and the like shown in the following examples are able to be properly changed without departing from the gist of the invention. Therefore, the scope of the present invention should not be restrictively interpreted by the following Examples.

Synthesis Example 1

A high-molecular weight liquid crystal compound P1 was synthesized according to the following procedures.

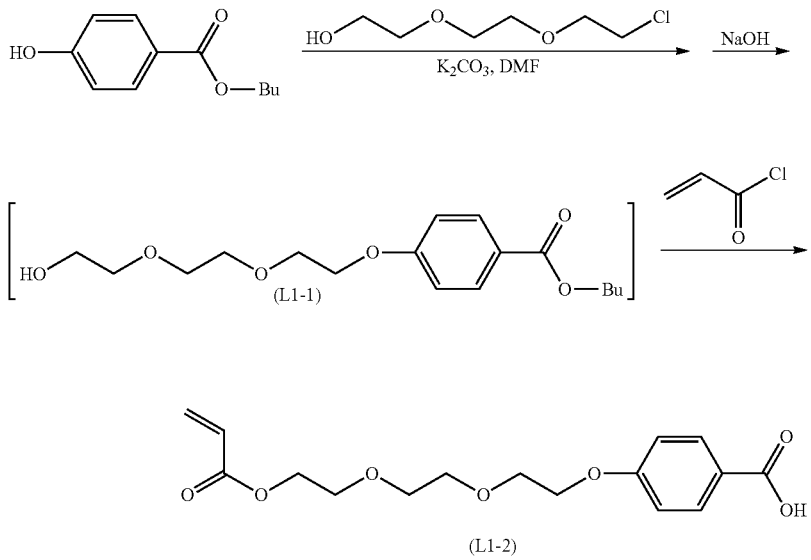

2-chloroethoxyethoxyethanol (244 g) and potassium carbonate (200 g) were added to an N,N-dimethylformamide (DMF) solution (300 mL) of butylparaben (201 g). After stirring at 95° C. for 9 hours, toluene (262 mL) and water (660 mL) were added thereto, and concentrated hydrochloric acid (147 g) was further added dropwise thereto. After stirring for 10 minutes, the mixture was allowed to stand, and then the reaction solution was washed by a liquid separation operation. A 28% by mass sodium methoxide methanol solution (500 g) and water (402 mL) were added to the obtained organic layer, and the mixture was stirred at 50° C. for 2 hours. Then, the organic solvent was distilled off by concentration, water (402 mL) was added, and concentration was carried out again at 50° C. until the weight reached 1.13 kg. Water (478 mL) was added to the obtained solution, and concentrated hydrochloric acid (278 g) was further added dropwise thereto. Ethyl acetate (1.45 kg) was added thereto, and the mixture was stirred at 30° C. for 10 minutes, and the aqueous layer was removed by a liquid separation operation. Next, a 20% by mass aqueous salt solution (960 mL) was added thereto, the mixture was stirred at 30° C. for 10 minutes, and the aqueous layer was removed by a liquid separation operation. N-methylpyrrolidone (824 g) was added to the obtained organic layer, and a concentration operation was carried out at 70° C. for 4 hours to obtain 1.13 kg of an N-methylpyrrolidone solution containing a compound L1-1. The next step was carried out using 1,085 g of the obtained N-methylpyrrolidone solution containing the obtained compound L1-1.

N,N-dimethylaniline (189 g) and 2,2,6,6-tetramethylpiperazine (1.5 g) were added to the obtained compound L1-1-containing N-methylpyrrolidone (NMP) solution (1,085 g), and after lowering the internal temperature by cooling, acrylic acid chloride (122 g) was further added dropwise thereto so that the internal temperature did not exceed 10° C. After stirring at an internal temperature of 10° C. for 2 hours, methanol (81 g) was added dropwise thereto and the mixture was stirred for 30 minutes. Ethyl acetate (1.66 kg), 10% by mass saline solution (700 mL), and IN aqueous hydrochloric acid solution (840 mL) were added thereto, and then the aqueous layer was removed by a liquid separation operation. Next, a 10% by mass aqueous salt solution (800 mL) was added thereto, the mixture was stirred at 30° C. for 10 minutes, and the aqueous layer was removed by a liquid separation operation. Next, a 20% by mass aqueous salt solution (800 mL) was added thereto, the mixture was stirred at 30° C. for 10 minutes, and the aqueous layer was removed by a liquid separation operation. A mixed solvent of hexane/isopropyl alcohol (1,780 mL/900 mL) was added to the obtained organic layer, the mixture was cooled to 5° C., stirred for 30 minutes, and then filtered to obtain 209 g of a white solid compound L1-2 (three-step yield: 65%). In the structural formula, Bu represents a butyl group.

$^1$H-uclear magnetic resonance (NMR) (solvent: $CDCl_3$) δ (ppm): 3.67 to 3.78 (m, 6H), 3.87 to 3.92 (m, 2H), 4.18 to 4.23 (m, 211), 4.31 to 4.35 (m, 2H), 5.80 to 5.85 (m, 1H), 6.11 to 6.19 (m, 1H), 6.40 to 6.46 (m, 1H), 6.93 to 6.98 (m, 2H), 8.02 to 8.07 (m, 2H)

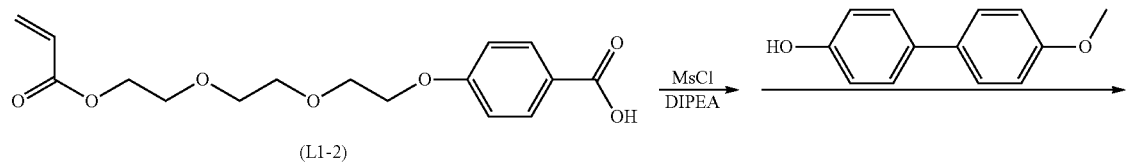

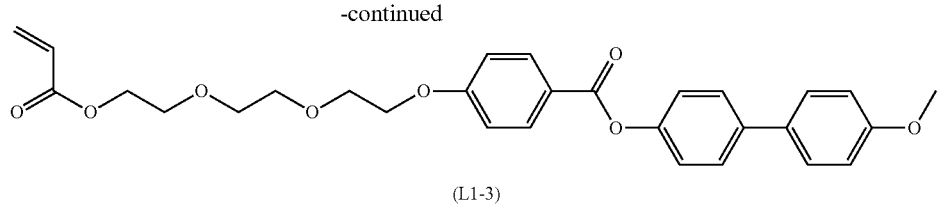

(L1-3)

Dibutyl hydroxytoluene (BHT) (200 mg) was added to a tetrahydrofuran (THF) solution (70 mL) of methanesulfonyl chloride (MsCl) (73.4 mmol, 5.7 mL), and the resultant mixture was cooled to an internal temperature of −5° C. The compound L1-2 (66.7 mmol, 21.6 g) and a THF solution of diisopropylethylamine (DIPEA) (75.6 mmol, 13.0 mL) were added dropwise thereto so that the internal temperature did not rise to 0° C. or higher. After stirring for 30 minutes at −5° C., N,N-dimethyl-4-aminopyridine (DMAP) (200 mg) was added thereto, and then a tetrahydrofuran (THF) and dimethylacetamide (DMAc) solution of diisopropylethylamine (75.6 mmol, 13.0 mL), and 4-hydroxy-4'-methoxybiphenyl (60.6 mmol, 12.1 g) were further added dropwise thereto so that the internal temperature did not rise to 0° C. or higher. Then, stirring was carried out for 4 hours at room temperature. The reaction was stopped by adding methanol (5 mL), and then water and ethyl acetate were added. The solvent was removed from the organic layer extracted with the ethyl acetate by a rotary evaporator, and purification by column chromatography using ethyl acetate and hexane was carried out to obtain 18.7 g of a compound L1-3 as a white solid (yield: 61%).

$^1$H-NMR (solvent: CDCl$_3$) δ (ppm): 3.65 to 3.82 (m, 6H), 3.85 (s, 3H), 3.85 to 3.95 (m, 2H), 4.18 to 4.28 (m, 2H), 4.28 to 4.40 (m, 2H), 5.82 (dd, 1H), 6.15 (dd, 1H), 6.43 (dd, 1H), 6.90 to 7.05 (m, 4H), 7.20 to 7.30 (m, 2H), 7.45 to 7.65 (m, 4H), 8.10 to 8.20 (m, 2H)

The impurities include the following compound L1-b.

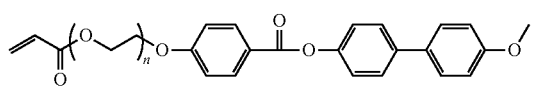

n is an integer excluding 3 (L1-b)

Ethyl 4-(4-hydroxyphenyl)benzoate was synthesized by the method described in Macromolecules, 2002, Vol. 35, pages 1663 to 1671.

2,2,6,6-tetramethylpiperidine-1-oxyl (68 mg) was added to an ethyl acetate solution (44 mL) of methanesulfonyl chloride (MsCl) (54.8 mmol, 6.27 g), and the resultant mixture was cooled to an internal temperature of −5° C. The compound (P1-1) (52.6 mmol, 17.1 g) and a THF solution of diisopropylethylamine (DIPEA) (57.0 mmol, 7.36 g) were added dropwise thereto such that the internal temperature did not rise to 0° C. or higher. After stirring at −5° C. for 30 minutes, a DMAc solution of ethyl 4-(4-hydroxyphenyl) benzoate (43.8 mmol, 10.6 g) and N-methyl-imidazole (NMI) (1.8 g) was added thereto, and then diisopropylethylamine (75.6 mmol, 13.0 mL) was further added dropwise thereto so that the internal temperature did not rise to 0° C. or higher. Then, stirring was carried out for 4 hours at room temperature. Water and ethyl acetate were added to terminate the reaction. The solvent was removed, by liquid separation, from the organic layer extracted with the ethyl acetate by a rotary evaporator, and purification by column chromatography using ethyl acetate and hexane was carried out to obtain 20.6 g of a compound L1-4 as a white solid (yield: 86%).

$^1$H-NMR (solvent: CDCl$_3$) δ (ppm): 1.41 (t, 3H), 3.68 to 3.80 (m, 6H), 3.88 to 3.95 (m, 2H), 4.20 to 4.27 (m, 2H), 4.31 to 4.38 (m, 2H), 4.41 (q, 2H), 5.83 (dd, 1H), 6.16 (dd, 1H), 6.43 (dd, 1H), 6.97 to 7.05 (m, 2H), 7.28 to 7.35 (m, 2H), 7.64 to 7.72 (m, 4H), 8.08 to 8.20 (m, 4H)

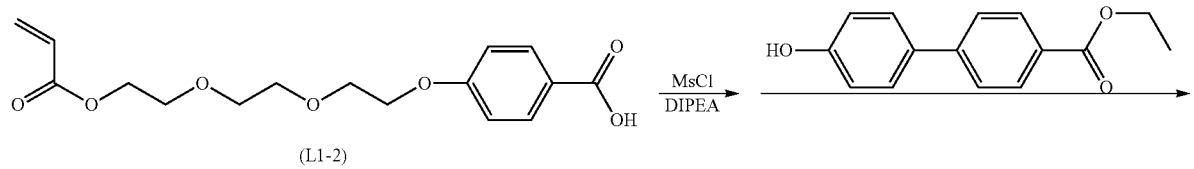

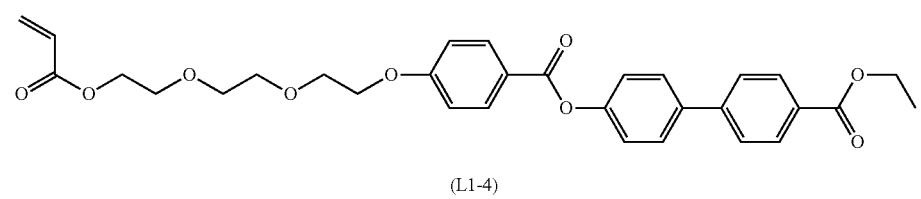

(L1-4)

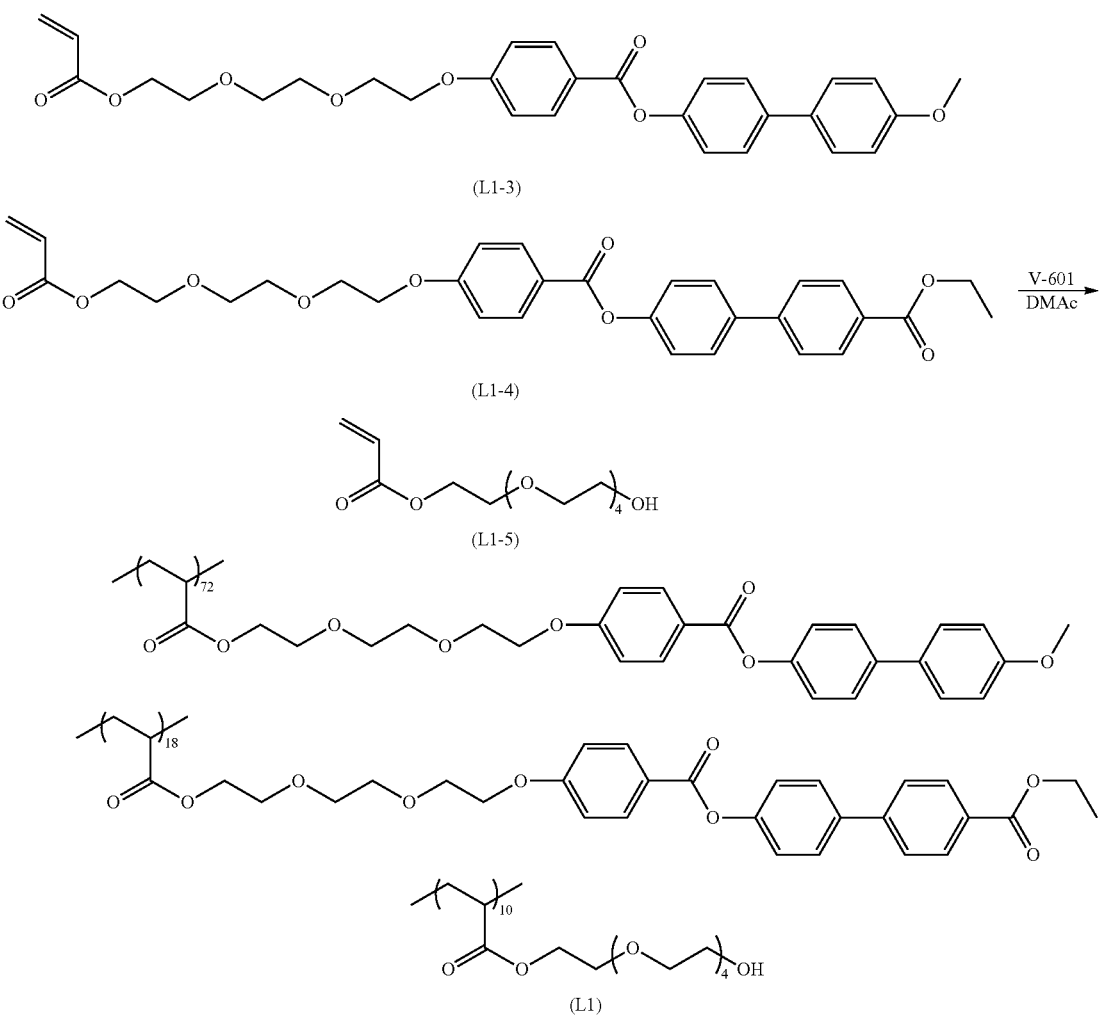

A DMAc solution (3.3 mL) of the compound L1-3 (0.72 g), the compound L1-4 (0.18 g), and the compound L1-5 (0.10 g) was heated to an internal temperature of 80° C. in a nitrogen stream. A DMAc solution (0.5 mL) of 2,2'-azobis (2-methylpropionic acid)dimethyl (0.015 g) (trade name "V-601", manufactured by FUJIFILM Wako Pure Chemical Corporation) was added thereto, and stirring was carried out for 2 hours at 80° C. Thereafter, the disappearance of the polymerizable group was confirmed by ¹H-NMR spectrum measurement, and the solution was cooled to room temperature. Methanol was added and filtration was carried out, and the residue was washed with methanol to obtain 0.91 g of a compound L1 as a white solid. When the obtained high-molecular weight liquid crystal compound L1 was analyzed by gel permeation chromatography (GPC), the weight-average molecular weight(Mw) was 16,000 (in terms of polystyrene).

Synthesis Example 2

A dichroic substance Y1 was synthesized as follows.

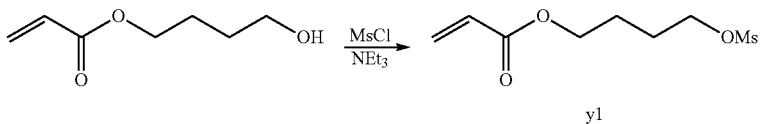

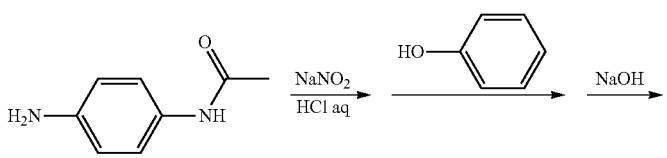

-continued

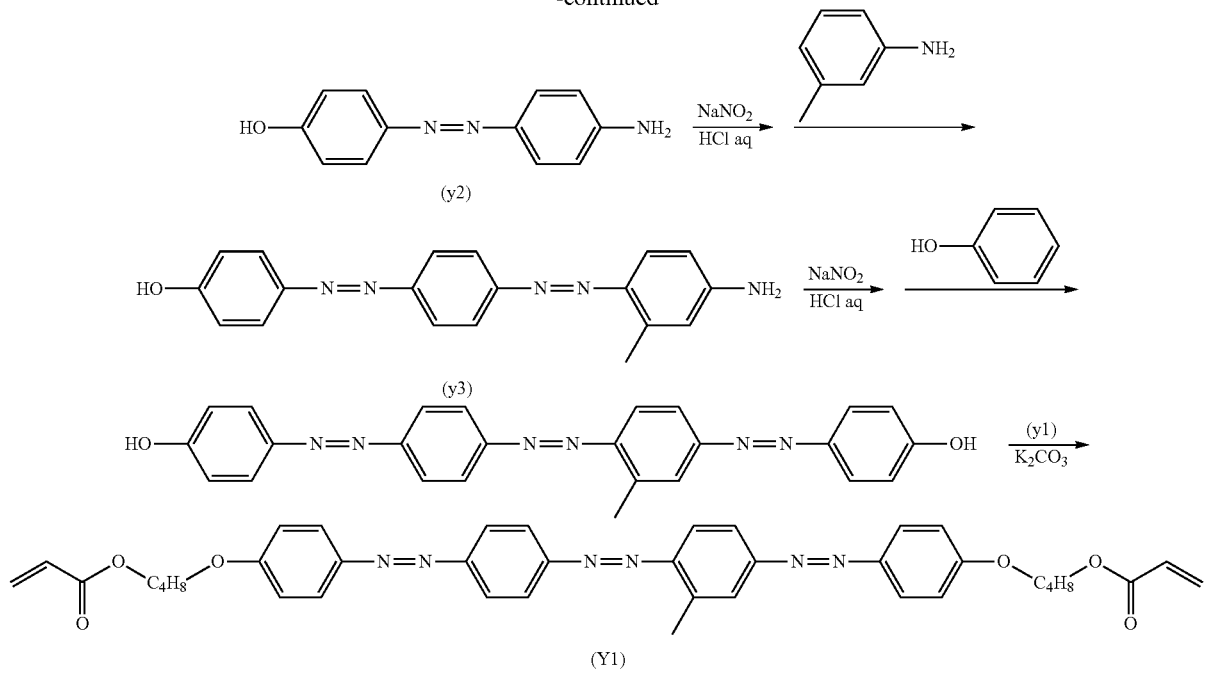

4-hydroxybutylacrylate (20 g) and methanesulfonyl chloride (16.8 g, MsCl) were dissolved in ethyl acetate (90 mL), and then triethylamine (16.4 g, Net₃) was added dropwise thereto while carrying out cooling in an ice bath. Then, after stirring at room temperature for 2 hours, IN HCl was added to carry out the liquid separation. The obtained organic layer was distilled off under reduced pressure to obtain a compound y1 (30 g).

Subsequently, a compound y2 (10 g) was synthesized according to the literature (Chem. Eur. J. 2004. 10. 2011).

The compound y2 (10 g) was dissolved in water (300 mL) and hydrochloric acid (17 mL), cooled in an ice bath, sodium nitrite (3.3 g) was added thereto, and the resultant mixture was stirred for 30 minutes. After further adding amidosulfuric acid (0.5 g), m-toluidine (5.1 g) was added, and stirring was carried out at room temperature for 1 hour. After stirring, the solid obtained by neutralizing with hydrochloric acid was collected by suction filtration to obtain the compound y2 (3.2 g).

After the compound y2 (1 g) was dissolved in a THF solution consisting of tetrahydrofuran (30 mL, THF), water (10 mL), and hydrochloric acid (1.6 mL), the resultant mixture was cooled in an ice bath, sodium nitrite (0.3 g) was added thereto, stirring was carried out for 30 minutes, and then, amidosulfuric acid (0.5 g) was further added thereto. Separately, phenol (0.4 g) was dissolved in potassium carbonate (2.76 g) and water (50 mL). The resultant mixture was cooled in an ice bath, and then the above THF solution was added dropwise thereto, and stirring was carried out at room temperature for 1 hour. After stirring, water (200 mL) was added thereto, and the obtained compound y3 (1.7 g) was suction-filtered.

The compound y3 (0.6 g), the compound y1 (0.8 g), and potassium carbonate (0.95 g) were dissolved in DMAc (30 mL, dimethylacetamide), and stirring was carried out at 90° C. for 3.5 hours. After stirring, water (300 mL) was added thereto, and the obtained solid was suction-filtered to obtain a first dichroic substance Y1 (0.3 g).

Synthesis Example 3

A dichroic substance M1 was synthesized as follows.

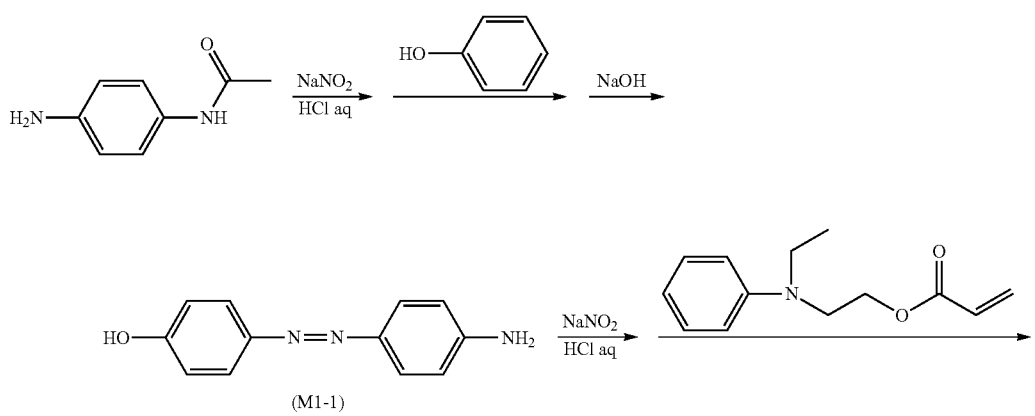

-continued

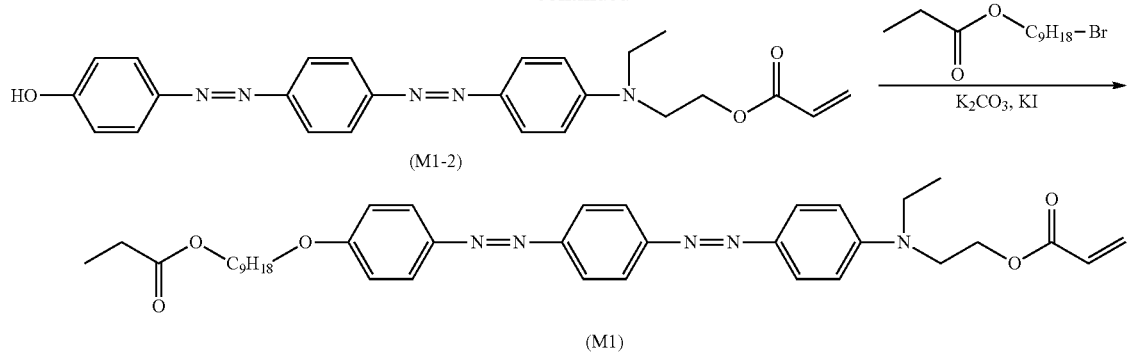

(M1-2)

(M1)

27 g of p-acetylaminoaniline was added to 100 ml of water, and the resultant solution was cooled to 0° C. and stirred. 66 ml of concentrated hydrochloric acid was added dropwise to this solution. Then, an aqueous solution prepared by dissolving 12.5 g of sodium nitrite (manufactured by FUJIFILM Wako Pure Chemical Corporation) in 30 ml of water was added dropwise. The internal temperature was kept at 0° C. to 5° C. After completion of the dropwise addition, stirring was carried out at 0° C. or lower for 1 hour, thereby adjusting a diazonium salt solution.

20 ml of methanol was added to 17.5 g of phenol, and the solution was stirred and dissolved. An aqueous solution prepared by dissolving 28.8 g of NaOH in 150 ml of water was added to this solution, and the resultant solution was cooled to 0° C. and stirred. The diazonium salt solution adjusted by the above method was added dropwise to this solution at 0° C. to 5° C. After completion of the dropwise addition, the mixture was stirred at 5° C. for 1 hour, and then stirring was carried out at room temperature for 1 hour to complete the reaction. Next, an aqueous solution prepared by dissolving 36.0 g of NaOH in 150 ml of water was added thereto, and the mixture was heated under reflux for 3 hours. After completion of the reaction, the mixture was cooled to room temperature, an aqueous hydrochloric acid solution was added thereto to adjust the pH to 7.0, and then precipitated crystals were filtered to obtain 40.2 g of a compound M1-1 (yield: 87.2%, brown crystals).

N-ethyl-N-(2-acryloyloxyethyl)aniline was synthesized from N-ethylaniline as a raw material according to U.S. Pat. No. 7,601,849B and a conventionally known method.

100 ml of acetic acid, 10 ml of water, and 20 ml of methanol were added to 5.0 g of the compound M1-1, and the solution was cooled to 0° C. and stirred. 7 ml of concentrated hydrochloric acid was added dropwise to this solution. Then, an aqueous solution prepared by dissolving 1.8 g of sodium nitrite in 5 ml of water was added dropwise thereto. The internal temperature was kept at 0° C. to 5° C. After completion of the dropwise addition, stirring was carried out at 0° C. or lower for 1 hour, thereby adjusting a diazonium salt solution.

To 8.4 g of N-ethyl-N-(2-acryloyloxyethyl)aniline synthesized as described above, 7.7 g of sodium acetate, 100 ml of methanol, and 100 ml of water were added and dissolved by stirring, and the resultant mixture was cooled to 0° C. and stirred. The diazonium salt solution adjusted by the above method was added dropwise to this solution at 0° C. to 5° C. After completion of the dropwise addition, the mixture was stirred at 5° C. for 1 hour, and then stirring was carried out at room temperature for 1 hour to complete the reaction. Precipitated crystals were filtered to obtain 6.2 g of a compound M1-2 (yield: 86.8%, brown crystals).

After 50.0 g of 1-bromononanol was dissolved in 500 ml of ethyl acetate, 26.5 g of triethylamine was added dropwise to the mixture, and stirring was carried out at 5° C. After 22.8 g of propionyl chloride was added dropwise to the mixture, the reaction was completed by stirring at room temperature for 1 hour. After completion of the reaction, 175 ml of water was added to carry out the liquid separation, and then 10 g of magnesium sulfate was added to the organic layer to carry out dehydration. The obtained organic layer was concentrated using a rotary evaporator to obtain propionic acid-9-bromononanol (52 g, a colorless and transparent liquid).

The compound M1-2 (7.2 g), potassium carbonate (7.7 g, 0.014 mmol), and potassium iodide (0.15 g, 0.002 mol) were added to 72 ml of dimethylacetamide, and the solution was heated and stirred at 80° C. 8.4 g of propionic acid-9-bromononanol synthesized as described above was added dropwise to this solution. After completion of the dropwise addition, the mixture was heated to 80° C. and stirred for 4 hours to complete the reaction. After completion of the reaction, the reaction solution was poured into water, and precipitated crystals were filtered and washed with water. The crystals were separated and purified by silica gel column chromatography (eluent: chloroform and subsequently chloroform/ethyl acetate=50/1 were used in order). Methanol was added to the residue, and the precipitated crystals were filtered, washed with methanol, and dried. In this manner, 5.5 g of a second dichroic substance M1 (orange crystals) was obtained.

$^1$H-NMR (solvent: CDCl$_3$) δ (ppm): 1.13 (t, 3H), 1.25 (t, 3H), 1.29 (br-s, 8H), 1.49 (m, 2H), 1.64 (m, 2H), 1.82 (m, 2H), 2.33 (q, 2H), 2.53 (m, 2H), 2.73 (t, 2H), 4.03 (q, 4H), 4.38 (t, 2H), 5.86 (d, 1H), 6.12 (dd, 1H), 6.43 (d, 1H), 6.83 (d, 2H), 7.00 (d, 2H), 7.94 (m, 8H)

Synthesis Example 4

The dichroic substance C1 was synthesized as follows.

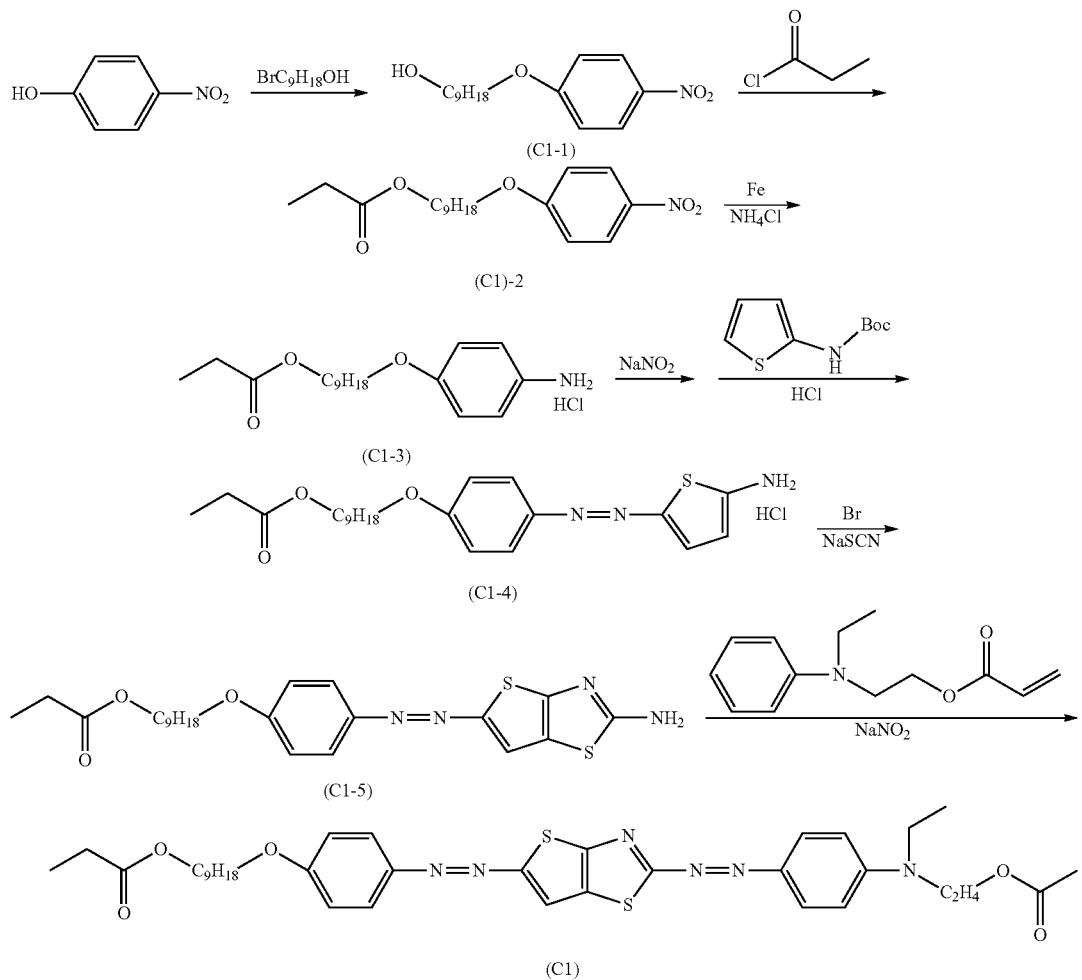

12.6 g of 4-nitrophenol, 20.0 g of 9-bromononanol, and 13.8 g of potassium carbonate were dissolved in 30 ml of N,N-dimethylacetamide (DMAc), and stirring was carried out at an external temperature of 105° C. for 2 hours. The temperature was lowered to room temperature, and the mixture was separated and washed with an aqueous solution of ethyl acetate and 10% ammonium chloride. The organic layer was dried over magnesium sulfate and then concentrated using a rotary evaporator to obtain a brown liquid (C1-1).

Next, 25 ml of DMAc was added to the obtained (C1-1), and the mixture was stirred under an ice bath. The temperature of the reaction system was maintained at 15° C. or lower, and 9.5 g of propionyl chloride was added dropwise, and after the dropwise addition, the mixture was stirred at room temperature for 1 hour. An aqueous solution of ethyl acetate and 10% ammonium chloride was added to carry out the liquid separation and washing. The separated liquid was dried over magnesium sulfate and then concentrated using a rotary evaporator to obtain a brown liquid (C1-2).

15.2 g of a Fe powder, 7.2 g of ammonium chloride, 20 ml of 2-propanol, and 10 ml of water were mixed and refluxed at an external temperature of 105° C. The yellow solid (M1-2) dissolved by heating in 30 ml of ethyl acetate was added dropwise to the refluxed system. After completion of the dropwise addition, the reaction was carried out under reflux for 30 minutes. After the temperature was lowered to room temperature, the iron powder was removed by filtration through celite, the filtrate was subjected to liquid separation with ethyl acetate/water, and the organic layer was washed with water three times.

The organic layer was concentrated using a rotary evaporator, and 15 ml of tetrahydrofuran (THF) and 15 ml of ethyl acetate were added thereto. A mixed solution of 240 ml of water and 20 ml of concentrated hydrochloric acid was added dropwise to this solution to obtain 15.3 g of the target (C1-3).

$^1$H-NMR (solvent: $CDCl_3$) δ (ppm): 1.03 (t, 3H), 1.25 to 1.48 (m, 11H), 1.58 (m, 2H), 1.71 (m, 2H), 2.30 (m, 2H), 3.97 (m, 4H), 7.01 (d, 2H), 7.29 (d, 2H), 10.04 (br-s, 3H)

2-aminothiophene hydrochloride was synthesized from 2-nitrothiophene according to the method described in the literature (Journal of Medicinal Chemistry, 2005, Vol. 48, p. 5794).

6.2 g of the target (C1-3) obtained above was added to a mixed solution of 15 ml of 12 mol/L hydrochloric acid, 30 ml of water, and 30 ml of THF, cooled to an internal temperature of 5 C or lower, and 1.4 g of sodium nitrite dissolved in 9 ml was dropwise to the mixture. A diazonium solution was prepared by stirring at an internal temperature of 5° C. or lower for 1 hour.

Next, 2.4 g of 2-aminothiophene hydrochloride was dissolved in 12 ml of water and 6 ml of hydrochloric acid, and the diazonium solution prepared above was added dropwise thereto at an internal temperature of 0° C. The reaction mixture was heated to room temperature and stirred for 2 hours. The precipitated solid was filtered and dried to obtain 6.3 g of a reddish orange solid (C1-4).

In the formula, "Boc" means a tert-butoxycarbonyl group.

$^1$H-NMR (solvent: CDCl$_3$) δ (ppm): 1.01 (t, 3H), 1.29 to 1.40 (m, 11H), 1.55 (m, 2H), 1.69 (m, 2H), 2.29 (m, 2H), 3.17 (s, 2H), 3.97 (m, 4H), 6.88 (br-s, 1H), 6.97 (d, 2H), 7.39 (d, 2H), 7.85 (m, 1H)

5.6 g of the reddish orange solid (C1-4) obtained above was suspended and dissolved in 100 ml of acetic acid, and 1.5 g of sodium thiocyanate was added to the mixture at room temperature. 2.0 g of bromine was added dropwise while cooling with water and maintaining the internal temperature at 20° C. or lower.

After stirring at room temperature for 2 hours, 100 ml of water was added, and the obtained solid was filtered and dried to obtain 5.3 g of a black solid (C1-5).

$^1$H-NMR (solvent: CDCl$_3$) δ (ppm): 1.14 (t, 3H), 1.30 to 1.50 (m, 11H), 1.60 (m, 6H), 1.81 (m, 2H), 2.32 (q, 2H), 4.04 (m, 4H), 5.31 (br, 2H), 6.95 (d, 2H), 7.66 (s, 1H), 7.78 (d, 2H)

4.7 g of the black solid (C1-5) obtained above was added to 6 ml of hydrochloric acid and 6 ml of acetic acid, 5 ml of an aqueous solution of 0.72 g of sodium nitrite was added dropwise at 0° C. or lower with ice-cooling, and after stirring for 1 hour, 0.52 mg of amidosulfuric acid was added to the mixture to obtain a diazonium solution.

The diazonium solution was added dropwise to a 10 ml methanol solution of 2.2 g of N-ethyl-N-(2-acryloyloxyethyl)aniline while maintaining the temperature thereof at 0° C. or lower. The temperature was raised to room temperature, and after stirring for 1 hour, 30 ml of water was added to the solution, and the obtained solid was filtered. Purification was carried out using a column, thereby obtaining 0.6 g of a blackish green solid compound (a third dichroic substance C1).

N-ethyl-N-(2-propionyloxy)aniline was synthesized from N-ethylaniline as a raw material according to U.S. Pat. No. 7,601,849B and a conventionally known method.

$^1$H-NMR (solvent: CDCl$_3$) δ (ppm): 1.13 (m, 6H), 1.25 to 1.52 (m, 15H), 1.82 (m, 2H), 2.35 (m, 4H), 3.54 (m, 2H), 3.72 (m, 2H), 4.08 (m, 4H), 4.31 (m, 2H), 6.81 (d, 2H), 7.00 (d, 2H), 7.86 (m, 3H) 7.94 (d, 2H)

Example 1

[Preparation of Alignment Film A]

A TAC base material (TG40, manufactured by FUJIFILM Holdings Corporation) having a thickness of 40 μm, which had been subjected to the saponification treatment, was coated with an alignment film coating liquid 1 having the following composition using a wire bar of #17. Then, drying was carried out with warm air at 110° C. for 2 minutes to form a polyvinyl alcohol (PVA) alignment film A on the TAC base material. In the case of the modified polyvinyl alcohol, the modified polyvinyl alcohol was added to the alignment film coating liquid A so that the solid content concentration was 4% by mass.

| Composition of alignment film coating liquid 1 | |
|---|---|
| Modified vinyl alcohol below | 2.00 parts by mass |
| Water | 74.08 parts by mass |
| Methanol | 23.86 parts by mass |
| Photopolymerization Initiator (IRGACURE 2959, manufactured by BASF SE) | 0.06 parts by mass |

Modified Polyvinyl Alcohol

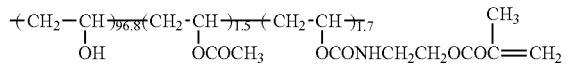

[Preparation of Light Absorption Anisotropic Film 1A]

The obtained alignment film A was subjected once to a rubbing treatment (roller rotation speed: 1,000 rotations/spacer thickness: 1.8 mm, stage speed 1.8 m/min), and the following liquid crystal composition 1 was applied with a wire bar of #7 to form a coating film.

Next, the coating film 1 was then heated at 140° C. for 40 seconds and cooled to 23° C. of room temperature.

Next, the coating film was heated at 85° C. for 10 seconds and cooled again to room temperature.

Then, irradiation was carried out using a high-pressure mercury lamp for 60 seconds under an irradiation condition of an illuminance of 28 mW/cm$^2$, to prepare a light absorption anisotropic film 1A, and the TAC base material, the alignment film A, and the light absorption anisotropic film 1A were laminated in order, whereby a laminate 1A was obtained.

| Composition of liquid crystal composition 1 | |
|---|---|
| Liquid crystal compound L1 below | 4.685 parts by mass |
| Dichroic substance Y1 below | 0.181 parts by mass |
| Dichroic substance M1 below | 0.278 parts by mass |
| Dichroic substance C1 below | 0.742 parts by mass |
| Interface improver F1 below | 0.060 parts by mass |
| Polymerization initiator I1 (IRGACURE 819: manufactured by BASF SE) | 0.054 parts by mass |
| Cyclopentanone | 47.000 parts by mass |
| Tetrahydrofuran | 47.000 parts by mass |

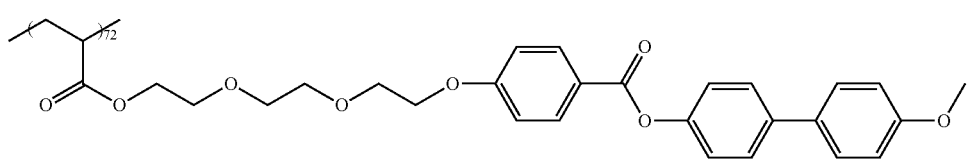

-continued

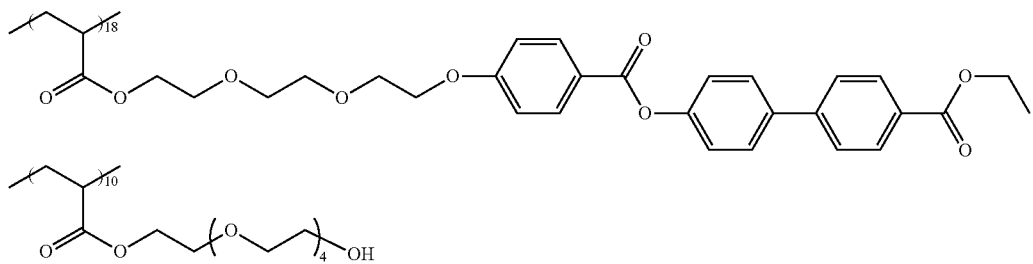
L1

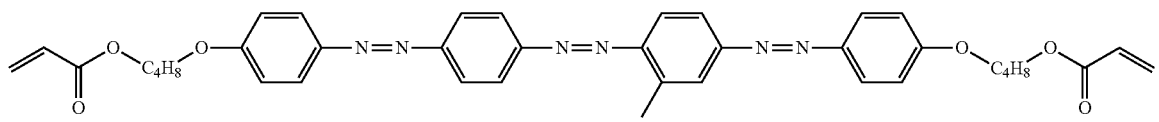

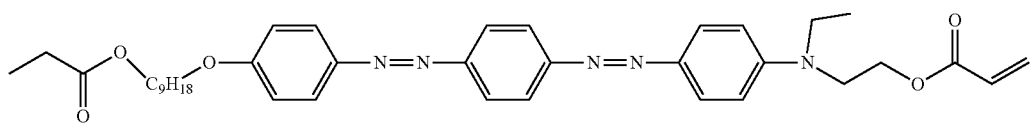
Y1

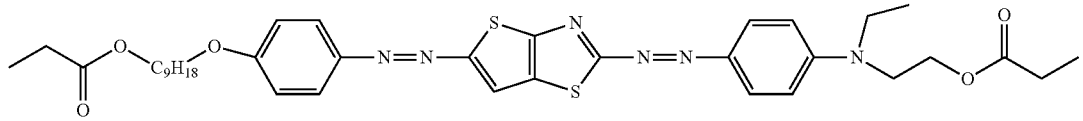
M1

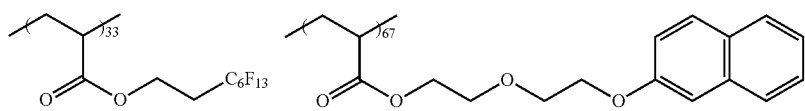
C1

F1

[Preparation of Light Absorption Anisotropic Film 1B]

The obtained alignment film A was coated with the coating liquid 1 for an optical alignment film and dried at 135° C. for 2 minutes. The coating film was irradiated with linearly polarized ultraviolet rays (irradiation dose: 10 mJ/cm²) using a polarized ultraviolet ray exposure device to prepare an optical alignment film B.

| Composition of coating liquid 1 for optical alignment film. | |
|---|---|
| Optical alignment material P1 below | 7.600 parts by mass |
| Polymerization initiator P-I | 0.400 parts by mass |
| Methyl ethyl ketone | 9.200 parts by mass |
| Butoxyethanol | 82.800 parts by mass |

P1

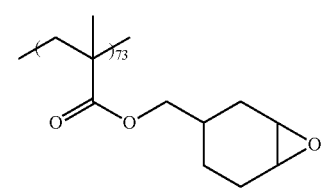

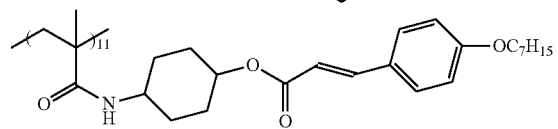

-continued

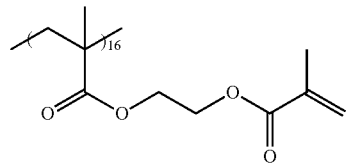

P-I

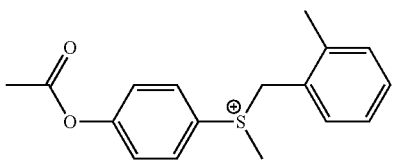

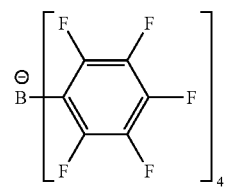

A light absorption anisotropic film 1B was prepared on the obtained alignment film B using the same materials and the procedures as those in the light absorption anisotropic film 1A described above, and then the TAC base material, the alignment film A, the alignment film B, and the light absorption anisotropic film 1B were laminated in order, whereby a laminate 1B was obtained.

Examples 2 to 8 and Comparative Examples 1 to 3

Laminates corresponding to the laminate 1A and the laminate 1B were prepared according to the same procedure as in Example 1, except that a liquid crystal composition having the composition shown in Table 1 was used instead of the liquid crystal composition 1.

However, in Examples 4, 5, and 7, and Comparative Example 3, at the time of preparing a laminate corresponding to the laminate 1B, an optical alignment material P2 having the structure below was used instead of the optical alignment material P1 below.

The structures of the high-molecular weight liquid crystal compound, dichroic substance, and optical alignment material P2, which was used in each of the examples are summarized below.

[Synthesis of High-Molecular Weight Liquid Crystal Compound]

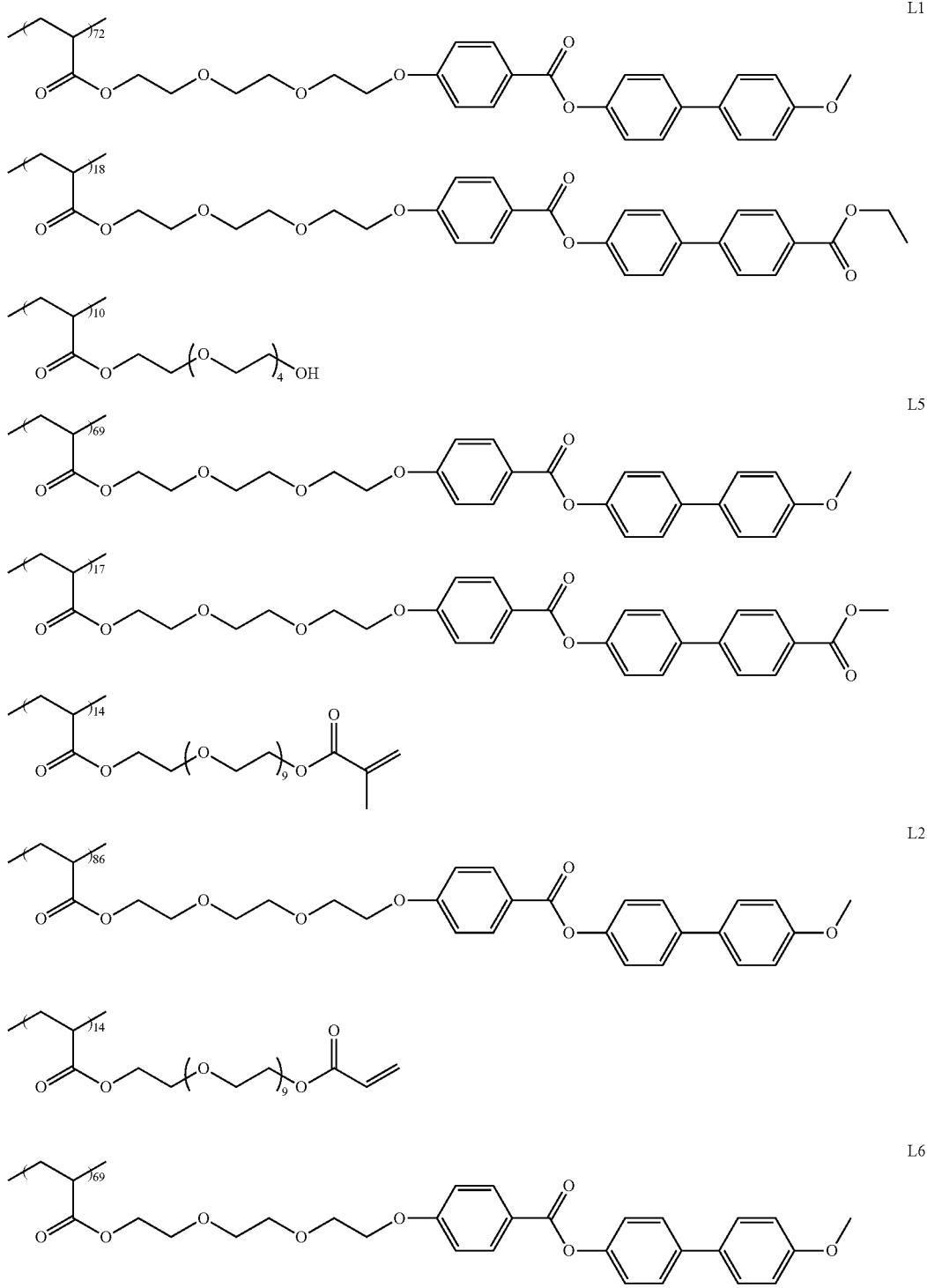

-continued
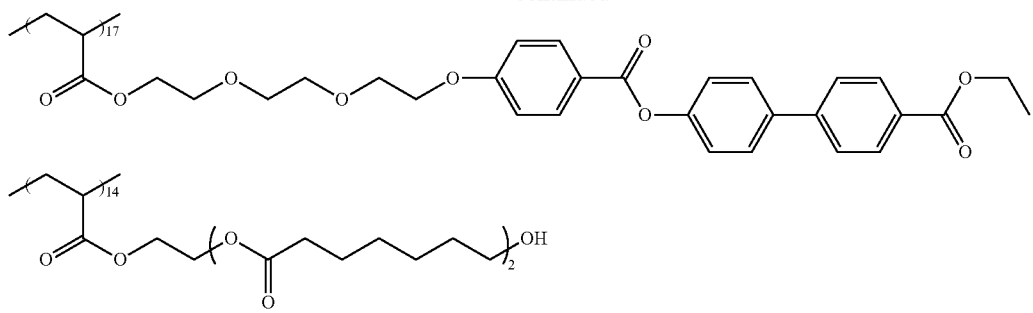
L3
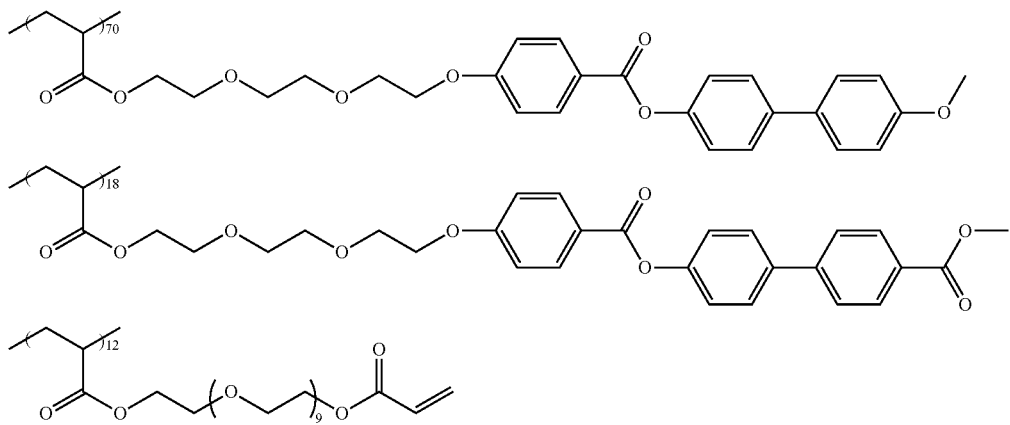
L7
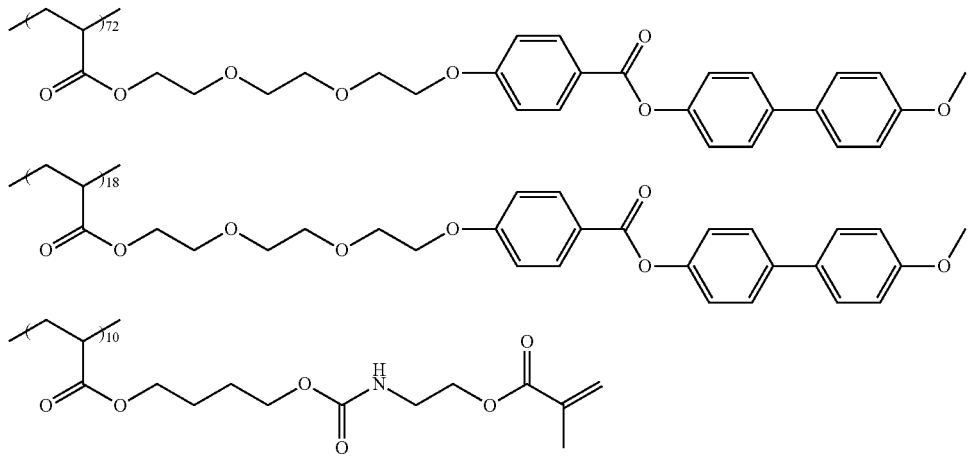
L4
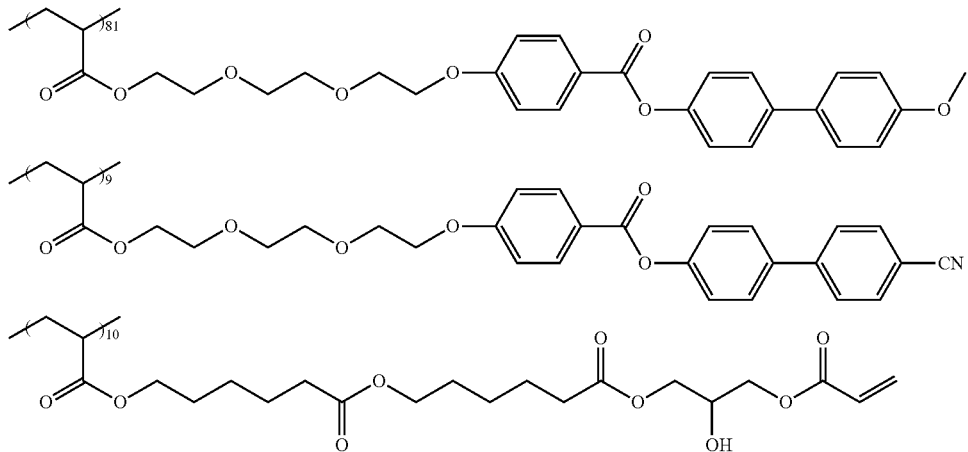

-continued
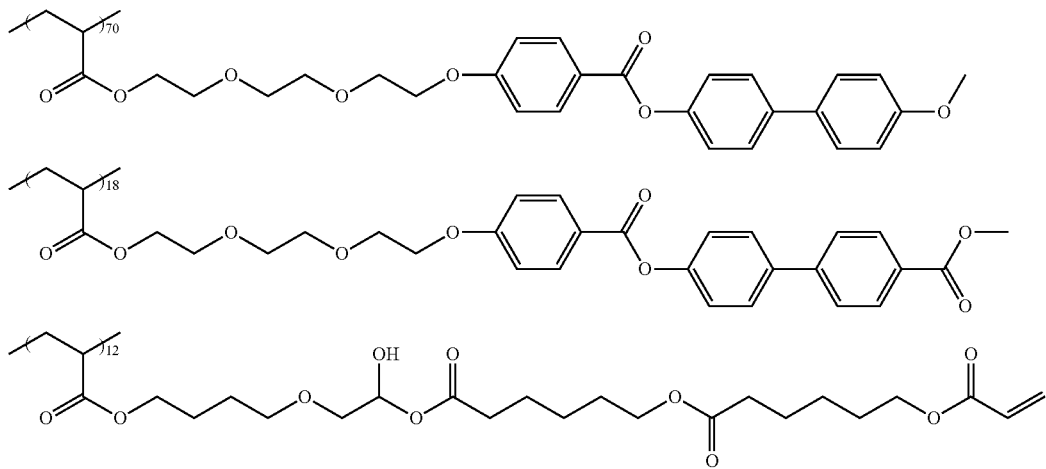
L8
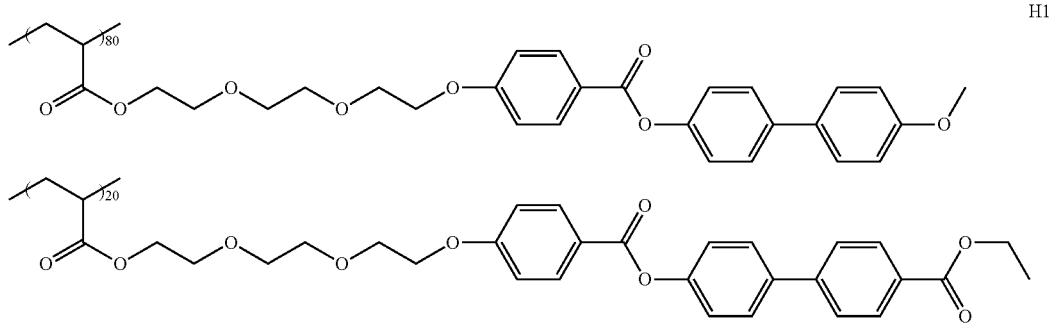
H1
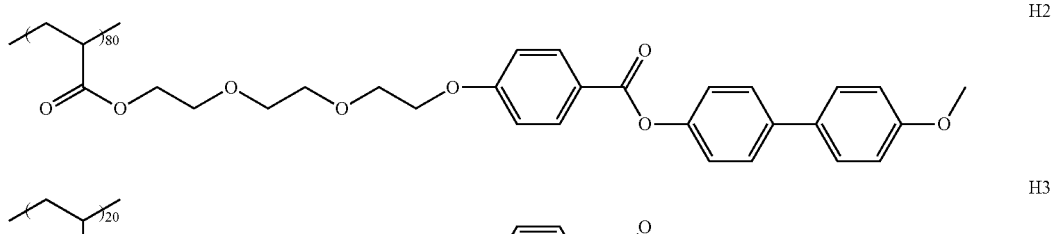
H2
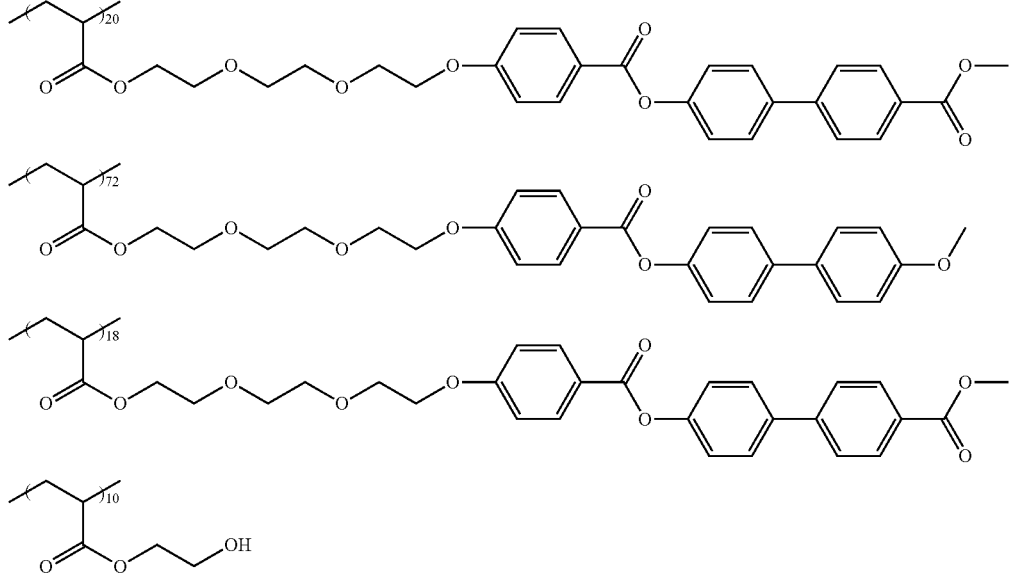
H3

[First Dichroic Substance]
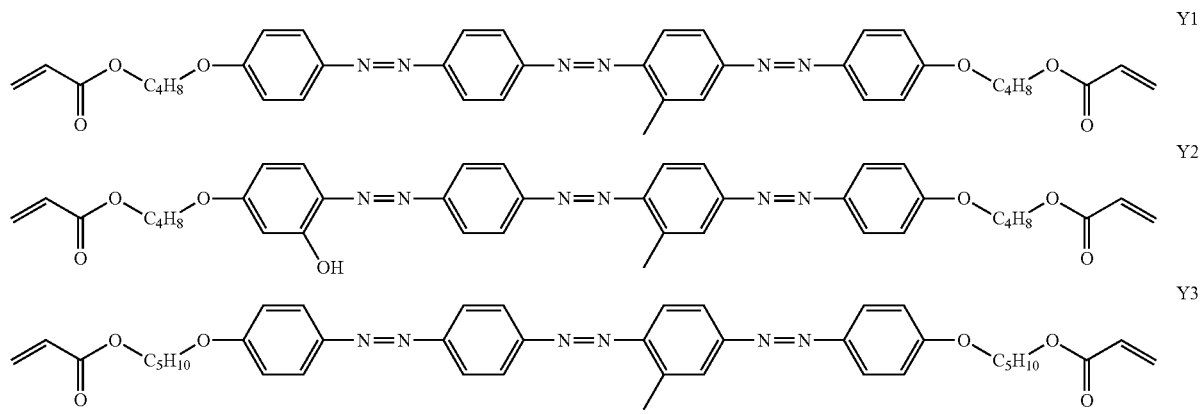
[Second Dichroic Substance]
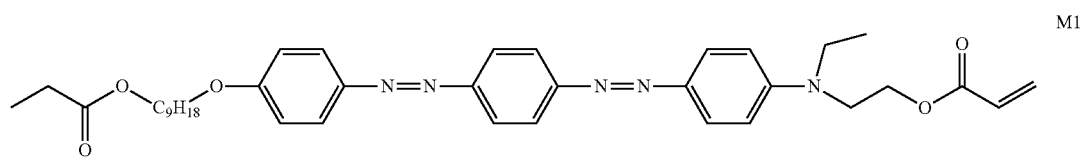
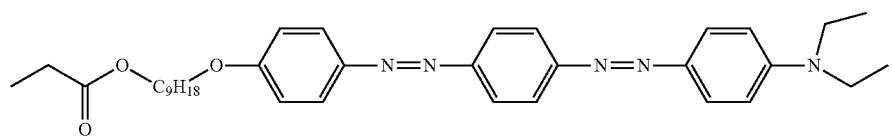
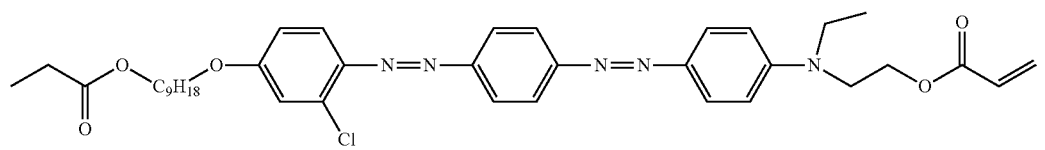
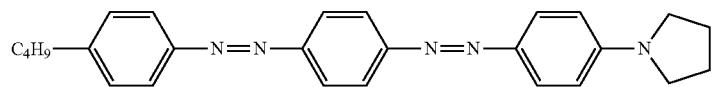
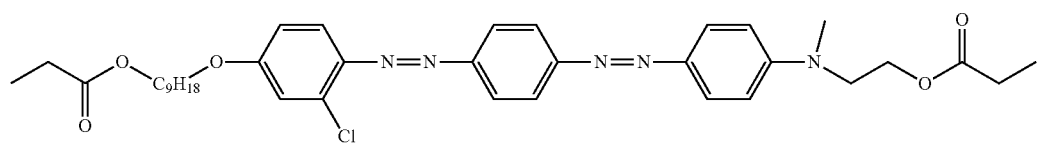
[Third Dichroic Substance]
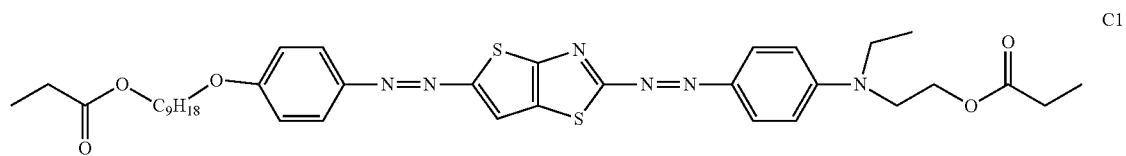

-continued

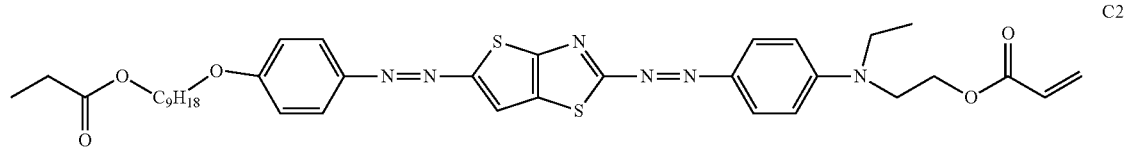

C2

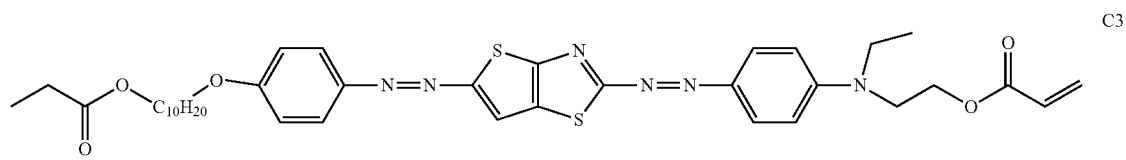

C3

[Optical Alignment Material P2]

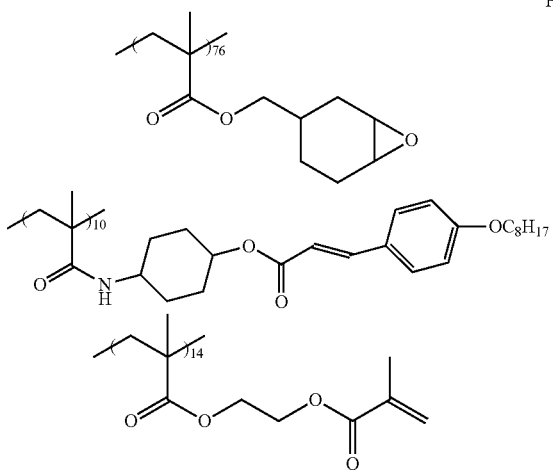

[Evaluation Test]
[Adhesiveness]

A cellophane tape was attached to the light absorption anisotropic film of the laminate 1A of Example 1, the cellophane tape was peeled off in the vertical direction, the peeling state of the light absorption anisotropic film was visually observed, and then the following evaluation was carried out.

In addition, each of the laminates of Examples and Comparative Examples corresponding to the laminate 1A was also tested by the same method, and then the following evaluation was carried out.

A: The light absorption anisotropic film was peeled off in a region equal to or less than half of the portion where the cellophane tape was attached.
B: The light absorption anisotropic film was peeled off in a region more than half of the portion to which the cellophane tape was attached but less than the entire surface of the portion where the cellophane tape was attached.
C: The light absorption anisotropic film was peeled off on the entire surface of the portion where the cellophane tape was attached.

[Alignment Degree]

In a state in which a linear polarizer was inserted on the light source side of an optical microscope (manufactured by Nikon Corporation, product name "ECLIPSE E600 POL"), the laminate 1A of Example 1 was set on a sample table, and using a multi-channel spectroscope (manufactured by Ocean Optics, Inc., product name: "QE65000"), an absorbance of the light absorption anisotropic film in a wavelength range of 380 nm to 780 nm was measured at a pitch of 1 nm, an alignment degree in 400 nm to 700 nm was calculated according to the following expression.

Alignment degree: $S=((Az0/Ay0)-1)/((Az0/Ay0)+2)$

Az0: Absorbance of dye film with respect to polarization in absorption axis direction
Ay0: Absorbance of dye film with respect to polarization in polarization axis direction In the above expression, "Az0" represents the absorbance of the light absorption anisotropic film with respect to polarization in the absorption axis direction, and "Ay0" represents the absorbance of the light absorption anisotropic film with respect to polarization in the polarization axis direction.

In addition, each of the laminates of Examples and Comparative Examples corresponding to the laminate 1A were also tested by the same method, an alignment degree was calculated.

[Surface Uniformity (Alignment Defect)]

The polarizer 1B of Example 1 was visually observed, and the plane shape (the alignment defect) was visually observed. Further, the polarizer 1B was punched to a size of 4 cm×4 cm, the number of alignment defects in a size range of 2.5 cm×2.5 cm was counted, and the following evaluation was carried out.

In addition, each of the laminates of Examples and Comparative Examples corresponding to the laminate 1B was also tested by the same method, and then the following evaluation was carried out.

A: Alignment defects are present locally or even in a case where alignment defects are present, the number thereof is 1.
B: Alignment defects are present on the entire surface, and the number thereof is 2 or more and 9 or less.
C: Alignment defects are present on the entire surface, and the number thereof is 10 or more.

TABLE 1

| | Optical alignment material | High-molecular weight liquid crystal compound | | | First dichroic substance | | Second dichroic substance | | Third dichroic substance | |
|---|---|---|---|---|---|---|---|---|---|---|
| | | Kind | Number of atoms in main chain of SP2 | Parts by mass | Kind | Parts by mass | Kind | Parts by mass | Kind | Parts by mass |
| Example 1 | P1 | L1 | 16 | 4.685 | Y1 | 0.181 | M1 | 0.278 | C1 | 0.742 |
| Example 2 | P1 | L2 | 31 | 4.721 | Y2 | 0.170 | M2 | 0.272 | C2 | 0.727 |
| Example 3 | P1 | L3 | 31 | 4.706 | Y1 | 0.157 | M3 | 0.260 | C3 | 0.772 |
| Example 4 | P2 | L4 | 19 | 4.722 | Y3 | 0.181 | M4 | 0.268 | C1 | 0.717 |
| Example 5 | P2 | L5 | 31 | 4.704 | Y1 | 0.189 | M5 | 0.271 | C2 | 0.725 |
| Example 6 | P1 | L6 | 20 | 4756 | Y2 | 0.154 | M1 | 0.267 | C2 | 0.713 |
| Example 7 | P2 | L7 | 11 | 4.720 | Y3 | 0.170 | M3 | 0.272 | C1 | 0.727 |
| Example 8 | P1 | L8 | 23 | 4.671 | Y3 | 0.151 | M2 | 0.284 | C3 | 0.789 |
| Comparative Example 1 | P1 | H1 | 0 | 4.779 | Y3 | 0.184 | M1 | 0.254 | C1 | 0.679 |
| Comparative Example 2 | P1 | H2 | 0 | 4.855 | Y1 | 0.178 | M2 | 0.615 | C2 | 0.246 |
| Comparative Example 3 | P2 | H3 | 4 | 4.649 | Y2 | 0.187 | M3 | 0.785 | C1 | 0.272 |

| | Interface improver | | Polymerization initiator | | | | | | Plane |
|---|---|---|---|---|---|---|---|---|---|
| | Kind | Parts by mass | Kind | Parts by mass | Tetrahydrofuran Kind | Cyclopentanone Parts by mass | Alignment degree | Adhesiveness | shape uniformity |
| Example 1 | F1 | 0.060 | I1 | 0.054 | 47.000 | 47.000 | 0.966 | B | A |
| Example 2 | F1 | 0.058 | I1 | 0.051 | 47.000 | 47.000 | 0.961 | A | A |
| Example 3 | F1 | 0.055 | I1 | 0.051 | 47.000 | 47.000 | 0.960 | A | A |
| Example 4 | F1 | 0.058 | I1 | 0.054 | 47.000 | 47.000 | 0.963 | A | A |
| Example 5 | F1 | 0.059 | I1 | 0.052 | 47.000 | 47.000 | 0.965 | A | A |
| Example 6 | F1 | 0.058 | I1 | 0.053 | 47.000 | 47.000 | 0.963 | B | A |
| Example 7 | F1 | 0.058 | I1 | 0.052 | 47.000 | 47.000 | 0.964 | B | B |
| Example 8 | F1 | 0.055 | I1 | 0.050 | 47.000 | 47.000 | 0.962 | A | A |
| Comparative Example 1 | F1 | 0.055 | I1 | 0.049 | 47.000 | 47.000 | 0.964 | C | C |
| Comparative Example 2 | F1 | 0.055 | I1 | 0.052 | 47.000 | 47.000 | 0.963 | C | C |
| Comparative Example 3 | F1 | 0.054 | I1 | 0.054 | 47.000 | 47.000 | 0.960 | C | C |

As shown in Table 1, it has been shown that in a case where a liquid crystal composition containing a dichroic substance and a high-molecular weight liquid crystal compound that has a repeating unit (1) and a repeating unit (2) is used (Examples 1 to 8), a light absorption anisotropic film that is excellent in adhesiveness and plane shape uniformity and has a high alignment degree can be formed.

Further, from the comparison between Examples 1 to 7, it has been shown that in a case where the number of atoms in the main chain of SP2 in the repeating unit corresponding to Formula (2) in the high-molecular weight liquid crystal compound is 15 or more (Examples 1 to 6 and 8), a light absorption anisotropic film that is more excellent in plane shape uniformity can be formed.

Further, from the comparison between Examples 1 to 6 and 8, it has been shown that in a case where the kind of T2 in the repeating unit corresponding to Formula (2) in the high-molecular weight liquid crystal compound is a polymerizable group such as a vinyl group, an acryloyloxy group, a methacryloyloxy group, an epoxy group, an oxetanyl group, or a maleimide group (Examples 2 to 5 and 8), a light absorption anisotropic film that is more excellent adhesiveness can be formed.

On the other hand, as shown in Table 1, in a case where a high-molecular weight liquid crystal compound having no repeating units corresponding to Formula (2) was used (Comparative Examples 1 and 2) and in a case where a high-molecular weight liquid crystal polymer compound having a repeating unit in which the number of atoms in the man chain of SP2 in Formula (2) is less than 10 was used (Comparative Example 3), a light absorption anisotropic film that exhibits high alignment degree but is inferior in adhesiveness and plane shape uniformity was obtained.

What is claimed is:

1. A liquid crystal composition comprising:
    a high-molecular weight liquid crystal compound; and
    a dichroic substance,
    wherein the high-molecular weight liquid crystal compound is a copolymer having a repeating unit (1) represented by Formula (1) and a repeating unit (2) represented by Formula (2),

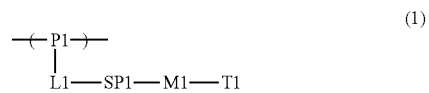
(1)

in Formula (1), P1 represents a main chain of the repeating unit, L1 represents a single bond or a divalent linking group, SP1 represents a spacer group, M1 represents a mesogenic group, and T1 represents a terminal group,

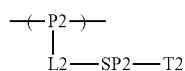
(2)

in Formula (2), P2 represents a main chain of the repeating unit, in Formula (2), L2 represents a single bond, a divalent alicyclic group which may have a substituent, or a divalent aromatic group which may have a substituent, in Formula (2), SP2 represents an alkylene group having 10 or more atoms in the main chain, where one or more pieces of —$CH_2$— constituting an alkylene group represented by SP2 may be substituted with at least one group selected from the group consisting of —O—, —S—, —N($R^{21}$)—, —C(=O)—, —C(=S)—, —C($R^{22}$)=C($R^{23}$)—, an alkynylene group, —Si($R^{24}$)($R^{25}$)—, —N=N—, —C($R^{26}$)=N—N=C($R^{27}$)—, —C($R^{28}$)=N—, and —S(=O)$_2$—, $R^{21}$ to $R^{28}$ each independently represent a hydrogen atom, a halogen atom, a cyano group, a nitro group, a linear alkyl group having 1 to 10 carbon atoms or a branched alkyl group having 3 to 10 carbon atoms, and hydrogen atoms contained in the one or more pieces of —$CH_2$— constituting an alkylene group represented by SP2 may be substituted with at least one group selected from the group consisting of a halogen atom, a cyano group, a nitro group, a hydroxyl group, a linear alkyl group having 1 to 10 carbon atoms, and a branched alkyl groups having 3 to 10 carbon atoms, and in Formula (2), T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an epoxycycloalkyl group, a maleimide group, an oxetanyl group which may have a substituent, or a phenyl group which may have at least one substituent selected from the group consisting of a boronic acid group, a sulfonic acid group, a vinyl group and an amino group.

2. The liquid crystal composition according to claim 1, wherein in Formula (2), the number of atoms in the main chain of SP2 is 15 or more.

3. The liquid crystal composition according to claim 1, wherein in Formula (2), T2 is a vinyl group, an acryloyloxy group, a methacryloyloxy group, an epoxy group, an epoxycycloalkyl group, a maleimide group, or an oxetanyl group which may have a substituent.

4. The liquid crystal composition according to claim 1, wherein in Formula (2), the one or more pieces of —$CH_2$— constituting an alkylene group represented by SP2 are substituted at least one group selected from the group consisting of —O—, —N($R^{21}$)—, and —C(=O)—.

5. The liquid crystal composition according to claim 1, wherein a content of the repeating unit (2) is 4% to 20% by mass with respect to a total mass of all repeating units contained in the high-molecular weight liquid crystal compound.

6. A light absorption anisotropic film which is formed from the liquid crystal composition according to claim 1.

7. A laminate comprising:
a base material; and
the light absorption anisotropic film according to claim 6, which is provided on the base material.

8. The laminate according to claim 7, further comprising a Y/4 plate which is provided on the light absorption anisotropic film.

9. An image display device comprising the light absorption anisotropic film according to claim 6.

10. An image display device comprising the laminate according to claim 7.

11. The liquid crystal composition according to claim 2, wherein in Formula (2), T2 is a vinyl group, an acryloyloxy group, a methacryloyloxy group, an epoxy group, an epoxycycloalkyl group, a maleimide group, or an oxetanyl group which may have a substituent.

12. The liquid crystal composition according to claim 2, wherein in Formula (2), the one or more pieces of —$CH_2$— constituting an alkylene group represented by SP2 are substituted at least one group selected from the group consisting of —O—, —N($R^{21}$)—, and —C(=O)—.

13. The liquid crystal composition according to claim 2, wherein a content of the repeating unit (2) is 4% to 20% by mass with respect to a total mass of all repeating units contained in the high-molecular weight liquid crystal compound.

14. A light absorption anisotropic film which is formed from the liquid crystal composition according to claim 2.

15. A laminate comprising:
a base material; and
the light absorption anisotropic film according to claim 14, which is provided on the base material.

16. The laminate according to claim 15, further comprising a Y/4 plate which is provided on the light absorption anisotropic film.

17. An image display device comprising the laminate according to claim 8.

18. An image display device comprising the laminate according to claim 15.

19. The liquid crystal composition according to claim 3, wherein in Formula (2), the one or more pieces of —$CH_2$— constituting an alkylene group represented by SP2 are substituted at least one group selected from the group consisting of —O—, —N($R^{21}$)—, and —C(=O)—.

20. The liquid crystal composition according to claim 3, wherein a content of the repeating unit (2) is 4% to 20% by mass with respect to a total mass of all repeating units contained in the high-molecular weight liquid crystal compound.

21. The liquid crystal composition according to claim 1, wherein in Formula (2), T2 represents a hydrogen atom, a methyl group, a hydroxyl group, a carboxy group, a sulfonic acid group, a phosphoric acid group, a boronic acid group, an amino group, a cyano group, a nitro group, a vinyl group, an acryloyloxy group, a methacryloyloxy group, an epoxy group, an epoxycycloalkyl group, a maleimide group, an oxetanyl group which may have a substituent, or a phenyl group which may have at least one substituent selected from the group consisting of a boronic acid group, a sulfonic acid group, a vinyl group and an amino group.

* * * * *